United States Patent
Yamaguchi et al.

(10) Patent No.: US 6,559,926 B2
(45) Date of Patent: May 6, 2003

(54) PATTERN FORMING APPARATUS AND PATTERN FORMING METHOD

(75) Inventors: Takako Yamaguchi, Kanagawa (JP); Ryo Kuroda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/971,663

(22) Filed: Oct. 9, 2001

(65) Prior Publication Data

US 2002/0044268 A1 Apr. 18, 2002

(30) Foreign Application Priority Data

Oct. 10, 2000 (JP) ........................................ 2000-309051
Sep. 14, 2001 (JP) ........................................ 2001-279252

(51) Int. Cl.⁷ ............................................. G03B 27/42
(52) U.S. Cl. ........................................... 355/53; 355/67
(58) Field of Search .............................. 355/53, 55, 67, 355/68, 69, 71

(56) References Cited

U.S. PATENT DOCUMENTS

| | | | |
|---|---|---|---|
| 5,981,962 A | * 11/1999 | Groves et al. | 250/398 |
| 6,097,473 A | * 8/2000 | Ota et al. | 355/53 |
| 6,194,711 B1 | 2/2001 | Tomita | 250/234 |
| 6,351,304 B1 | * 2/2002 | Kawashima et al. | 250/492.2 |
| 6,366,340 B1 | * 4/2002 | Ishibashi et al. | 355/69 |
| 2001/0011700 A1 | 8/2001 | Shimada et al. | 250/234 |

FOREIGN PATENT DOCUMENTS

| | | |
|---|---|---|
| JP | 7-106229 | 4/1995 |
| JP | 10-253643 | 9/1998 |
| JP | 11-64350 | 3/1999 |
| JP | 11-101808 | 4/1999 |
| JP | 2000-146803 | 5/2000 |

OTHER PUBLICATIONS

Ohtsu, G. and S. Kawata, "Process for Manufacturing Vent–Type Optical Fiber Probes," *Near–field Nano–photonics Handbook Optoronics*, 1997, pp. 42–49 (with extracted translation).

\* cited by examiner

*Primary Examiner*—Russell Adams
*Assistant Examiner*—D. Ben Esplin
(74) *Attorney, Agent, or Firm*—Fitzpatrick, Cella, Harper & Scinto

(57) ABSTRACT

A pattern forming apparatus for forming a pattern on a substrate includes a first exposure section capable of conducting pattern exposure for a predetermined line width, a second exposure section for conducting pattern exposure for a line width greater than the predetermined linewidth of the first exposure section, and a device for detecting the relative positional relationship between the first exposure section and the second exposure section. Pattern exposure is conducted by using the first exposure section and the second exposure section on the basis of the detected positional relationship.

16 Claims, 15 Drawing Sheets

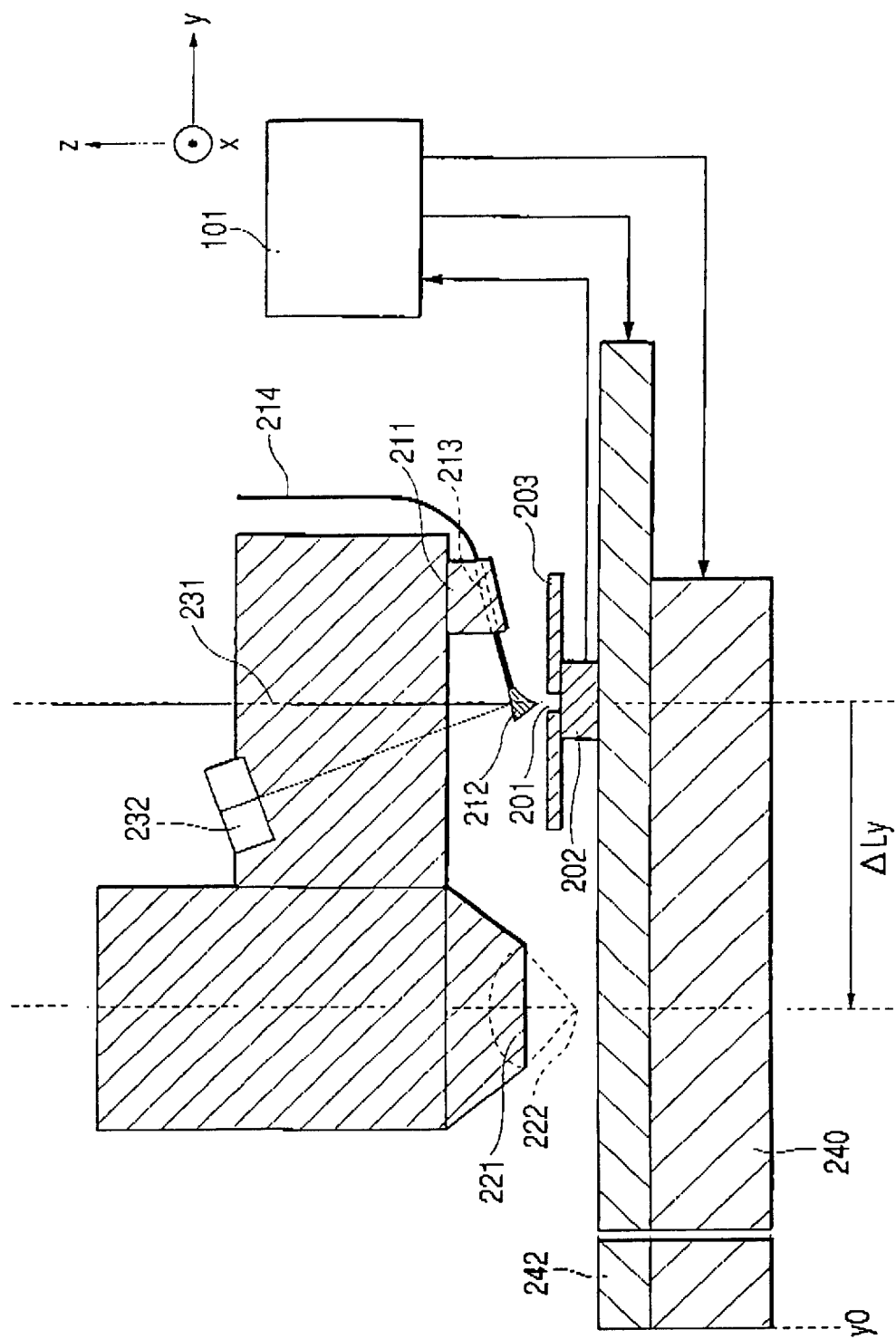

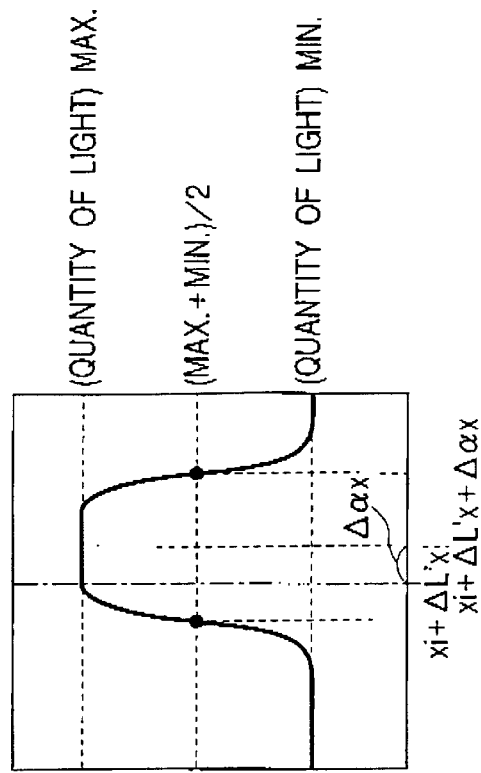
FIG. 5A
FIG. 5C
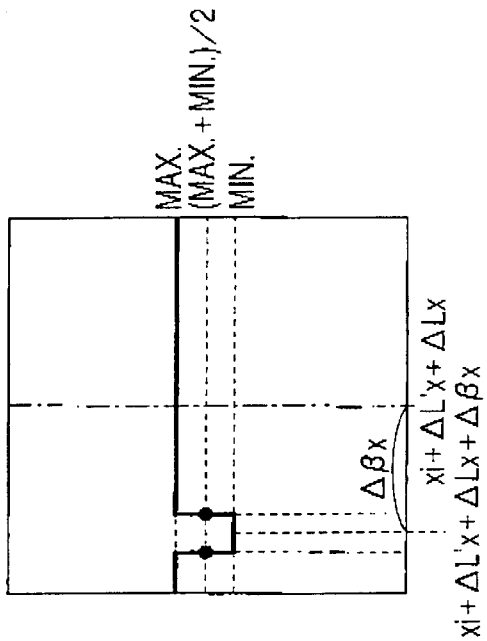
FIG. 5B
FIG. 5D

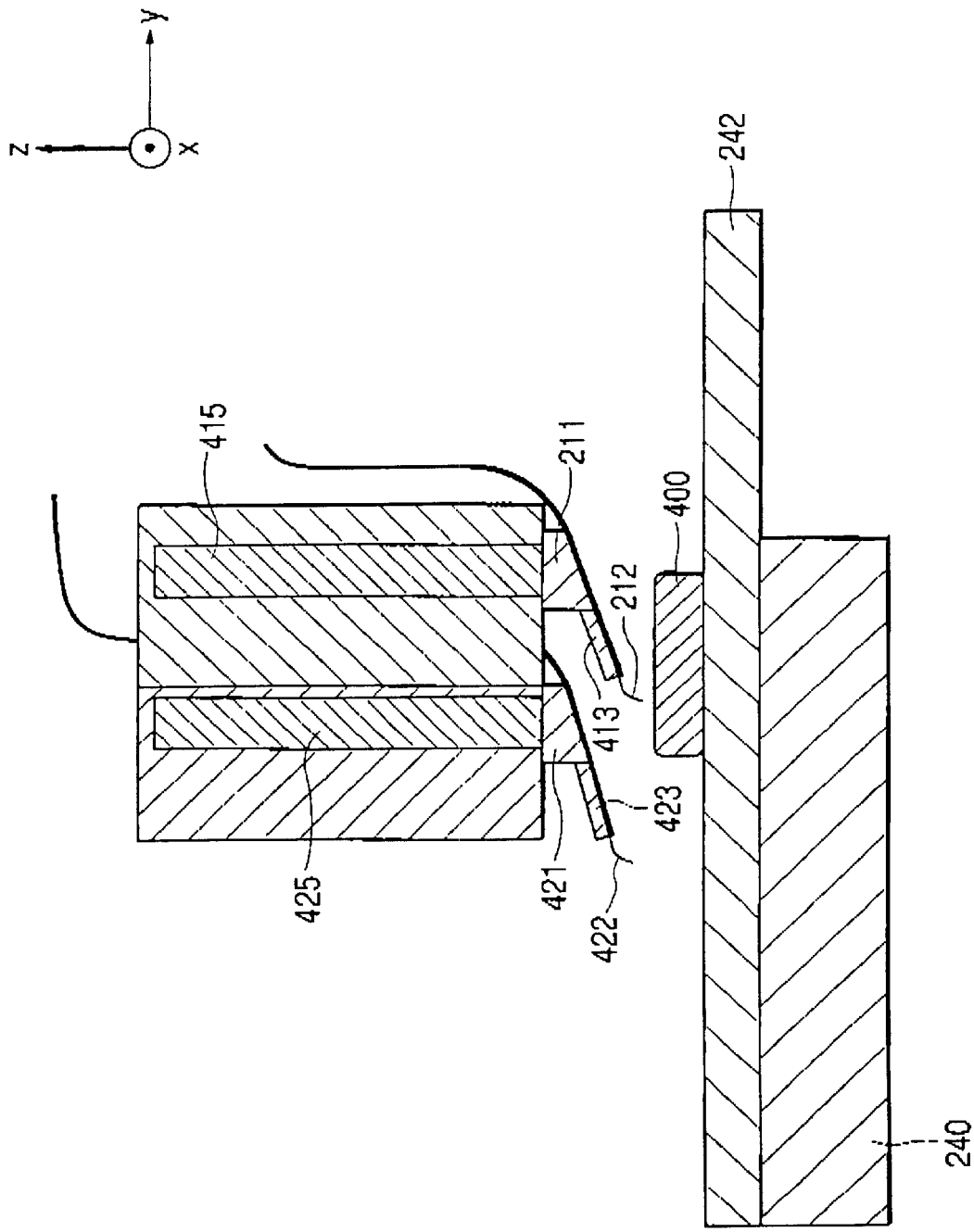

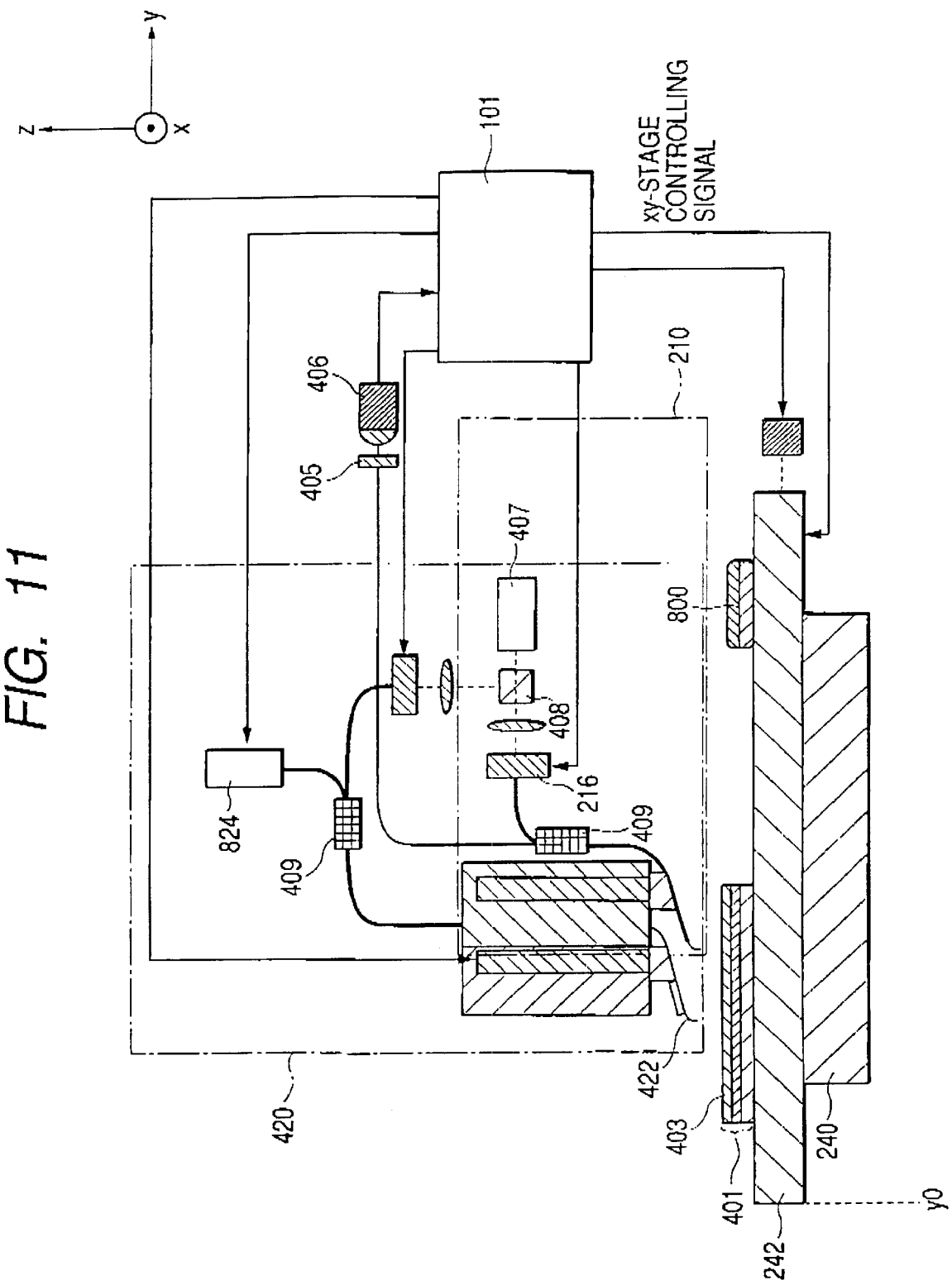

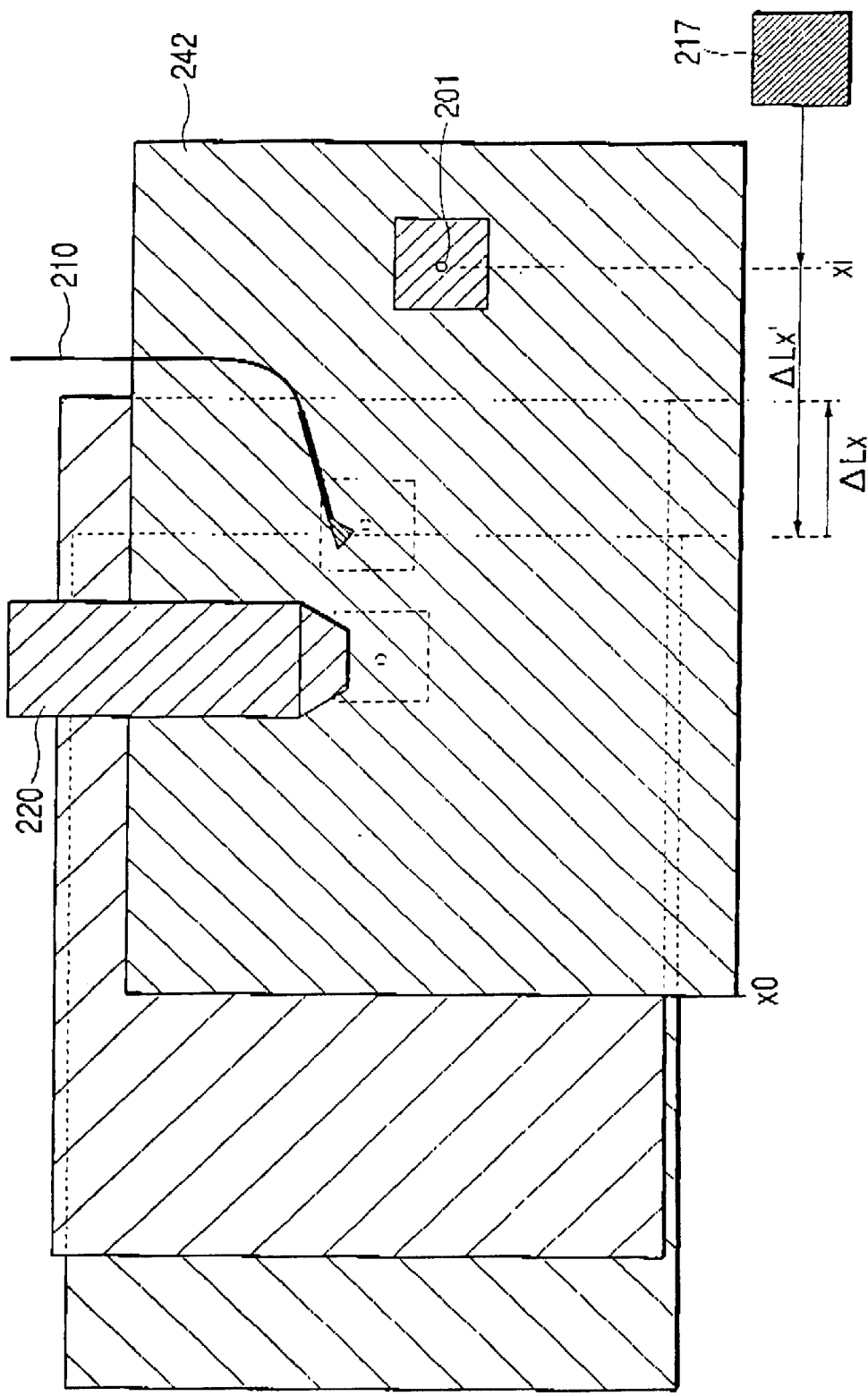

PATTERN FORMING APPARATUS AND PATTERN FORMING METHOD

BACKGROUND OF THE INVENTION

1. Field of the Invention

This invention relates to a pattern forming apparatus and also to a pattern forming method. More particularly, the present invention relates to a pattern forming apparatus and a pattern forming method that can dramatically improve the throughput even when fine patterns with a size less than the wavelength of light and bold line patterns or solid large area patterns coexist.

2. Related Background Art

With the technological developments in the field of large capacity semiconductor memories and high speed CPUs using ICs in recent years, micronized optical lithography has become indispensable to the industry.

Micronized optical lithography has been realized by using short wavelength light for optical lithography systems. Currently, near ultraviolet laser beams are used for state-of-the-art micro-processing of about 0.1 $\mu$m.

However, for further micronization, a number of technological problems have to be solved, including the use of laser beams with shorter wavelengths, development of lenses that can cope with such short wavelengths and so on.

Meanwhile, techniques using a near-field have been proposed for forming photoresist patterns with a width less than the wavelength of light by using light.

For instance, Japanese Patent Application No. 7-106229 discloses an exposure system using a near-field probe for scanning. The near-field probe is prepared by sharpening the front end of an optical fiber by wet etching.

However, since the known system disclosed in the above patent document uses a probe having a micro-aperture at the front end for pattern lithography, a long exposure time is required for preparing a large solid pattern. Therefore, such a system cannot dramatically improve the throughput.

SUMMARY OF THE INVENTION

In view of the above-identified circumstances, it is, therefore, an object of the present invention to provide a pattern forming apparatus and a pattern forming method that can produce patterns highly accurately to dramatically improve the throughput even when fine patterns and bold line patterns or solid large area patterns coexist.

In an aspect of the present invention, the above object is achieved by providing a pattern forming apparatus comprising:

a first exposure section capable of conducting pattern exposure for a predetermined line width;

a second exposure section for conducting pattern exposure for a line width greater than said predetermined line width of said first exposure section; and means for detecting the relative positional relationship between said first exposure section and said second exposure section, wherein pattern exposure is conducted by using said first exposure section and said second exposure section on the basis of the detected positional relationship.

In another aspect of the invention, there is provided a pattern forming method comprising the steps of:

detecting the positional relationship of a first exposure section capable of conducting pattern exposure for a predetermined line width and a second exposure section for conducting pattern exposure for a line width greater than said predetermined line width of said first exposure section; and conducting a first exposure step using said first exposure section, subsequently aligning said second exposure section to an exposure position on the basis of the detected positional relationship and conducting a second exposure step using said second exposure section.

BRIEF DESCRIPTION OF THE DRAWINGS

FIG. 4 is a schematic illustration of observing the center of exposure of a near-field probe exposure system.

FIGS. 5A, 5B, 5C and 5D are illustrations of the quantity and the area of illumination of light transmitted through a position detecting aperture.

FIG. 8 is an enlarged partial view of the pattern forming apparatus of FIG. 7.

FIG. 11 is a schematic block diagram of the pattern forming apparatus according to the invention as used in Example 4.

FIG. 15 is a schematic illustration of an xy-stage when observing the displacement of the centers of exposure of two exposure systems.

DESCRIPTION OF THE PREFERRED EMBODIMENTS

According to the invention, two exposure sections (exposure mechanisms) are used for the exposure of a bold pattern and that of a fine pattern so that the exposures can be conducted with an enhanced degree of precision at high speed to improve the throughput of pattern preparation.

Now, the present invention will be described by referring to the accompanying drawings that illustrate preferred embodiments of the invention.

Figure 1:
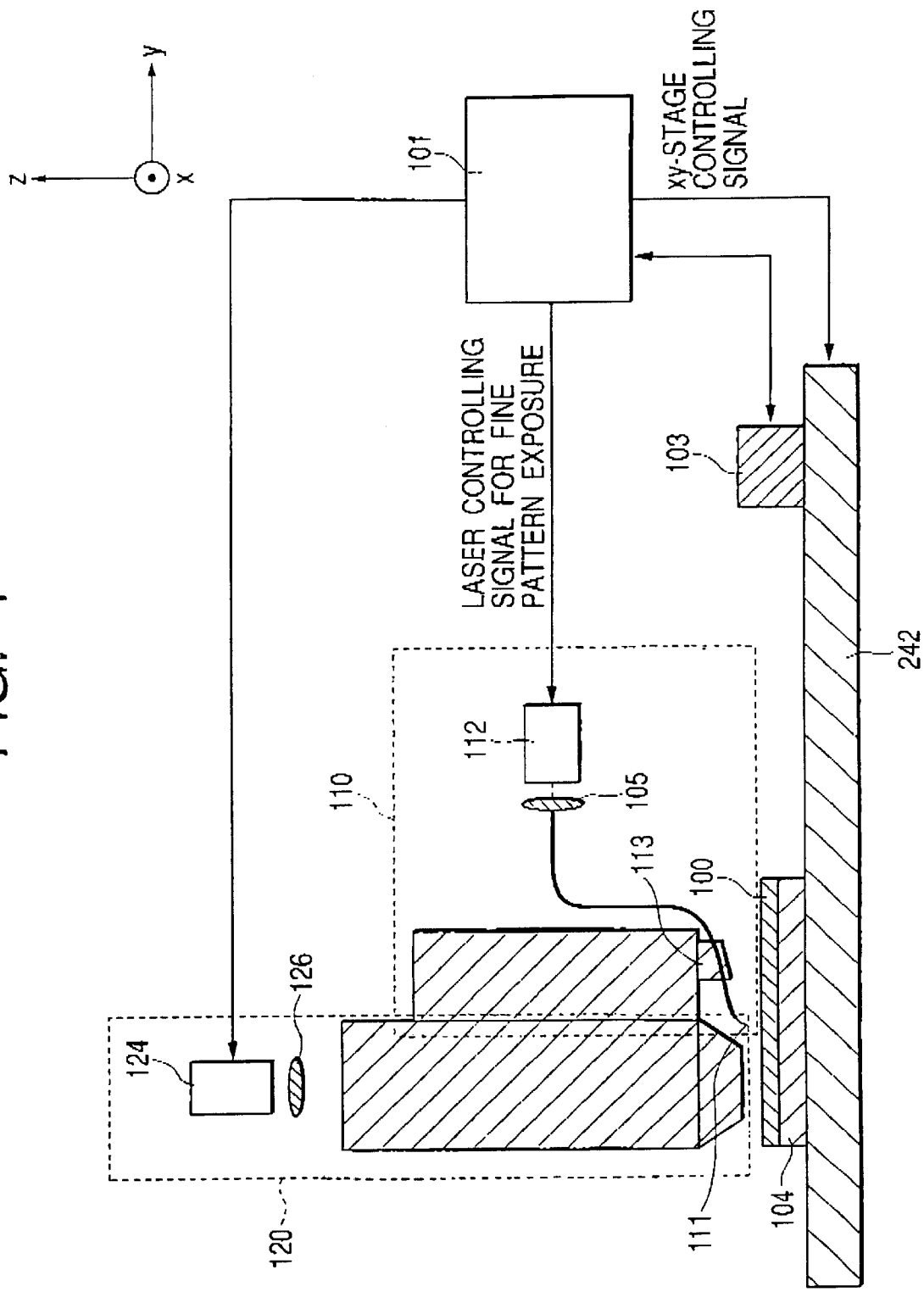
FIG. 1 is a schematic block diagram of the pattern forming apparatus according to the invention as used in Example 1.

FIG. 1 is a schematic block diagram of an embodiment of a pattern forming apparatus according to the invention.

With this embodiment of the invention, an exposure pattern is formed in a manner as described below.

First, an exposure pattern is formed by means of an image forming computer program. Then, the data on the prepared exposure pattern are input to a computer 101. At this time, the pattern data are classified into two categories in order to use a second exposure mechanism 120 for bold pattern exposure and to use a first exposure mechanism 110 for fine pattern exposure and a line width smaller than a line width of the bold pattern.

Now, the first exposure mechanism of this embodiment of the pattern forming apparatus will be described below.

The first exposure mechanism 110 is a two-dimensional scanning type exposure mechanism adapted to prepare a pattern with a width less than 100 nm by means of near-field light.

As light is made to enter the probe 111 of this exposure mechanism having a micro-aperture less than the wavelength of light at the front end thereof from a laser 112 for fine pattern exposures, a near-field is formed near the micro-aperture. The near-field exists locally only near the micro-aperture and its intensity is attenuated exponentially as a function of the distance from the micro-aperture.

As a photoresist 100 is brought close to the area of the near-field, the latter is disturbed by the former to produce scattered light, to which the photoresist 100 is exposed to form a latent image thereof. The area where the near-field is found is as small as about 100 nm when the aperture diameter of the micro-aperture is 100 nm.

A probe 111 having an aperture less than 100 nm at the front end can be prepared typically by bringing in a piece of optical fiber, sharpening the front end thereof by chemical etching or drawing, and then coating it with a metal, except for the front end, so that a micro-aperture may be produced at the front end (G. Ohtsu and S. Kawata, Near-Field Nano-Photonics Handbook Optoronics, 1997).

A quadrangular pyramid-type probe having a micro-aperture at the apex of the pyramid can be prepared by means of a semiconductor process involving the use of anisotrophic etching of Si (Japanese Patent Application No. 11-064350). A support rod adapted to operate as an optical waveguide may be fitted to such a probe to provide it with a profile like that of a cantilever.

A probe 111 having a profile like that of a cantilever can also be prepared by applying force or heat to a side thereof and bending it if the material of the probe has a property of an optical waveguide. When preparing a probe 111, the operation of sharpening the front end of the material and forming a micro-aperture may be conducted either before or after the operation of bending it at or near the front end thereof.

Thus, a typical process of preparing such a probe 111 may comprise the steps of sharpening the front end of a piece of optical fiber by chemical etching, bending the optical fiber at or near the front end thereof and coating it with metal, except for the front end.

The probe 111 prepared in a manner as described above is fitted to a probe support table 113 to positionally secure the probe. The probe 111 may be secured in position by means of a magnetic force or a vacuum chuck. When the probe 111 is replaced by a new one, a positional displacement in the nanometer scale can occur. Therefore, it is necessary to accurately correct the position by means of a relative displacement computing unit as will be described hereinafter.

For an operation of exposure using near-field, the micro-aperture and the photoresist 100 need to be brought close to each other until they are separated by a distance less than 100 nm. Methods that can be used for controlling the distance separating them will be listed below.

The distance separating the micro-aperture at the front end of a probe 111 and photoresist 100 may be controlled by controlling the piezoelectric device or the drive mechanism fitted to the probe 111 or the stage 102 on the basis of the distance detection signal obtained for the distance between the micro-aperture at the front end and the photoresist 100 by means of a shear focusing method (Japanese Patent Application No. 11-101808), a method utilizing the operating principle of an optical lever (Japanese Patent Application No. 2000-146803) or a method of referring to the voltage change of a piezoelectric device fitted to the probe (Japanese Patent Application No. 10-253643).

When conducting scanning of the probe 111 for exposure while in contact, a soft probe having a modulus of elasticity of about 0.1N/m needs to be used so that the photoresist 100 may not be damaged by the probe 111.

For exposing the photoresist 100 to light, a laser beam that is emitted from a laser 112 for fine pattern exposure in the light sensitive region of the photoresist 100 and is made to pass through the probe 111 is caused to irradiate a position specified in terms of exposure pattern data for exposure by the first exposure mechanism 110 by appropriately shifting the relative position of the photoresist 100 and the stage 102.

Irradiation/non-irradiation of light for exposure is switched by turning on/off the power source of the laser. There may be lasers that require a cooling period before turning off the laser power source and/or a standby period before restarting the beam irradiating operation. If such is the case, it is preferable that irradiation/non-irradiation of light for exposure is switched by using an external unit such as an AOM (acoustic optical modulator), while keeping the laser oscillating, because this arrangement can improve the throughput.

The probe 111 may be positionally shifted relative to the photoresist 100 by moving the probe 111 by means of a piezoelectric device or an electric motor. The probe 111 can be moved more accurately when such a piezoelectric device or an electric motor is combined with an external position detecting device such as a laser interferometer for feedback purposes.

The probe 111 and the photoresist 100 may be moved relative to each other by moving the probe 111, while holding the photoresist stationary, or vice versa. Alternatively, both the probe 111 and the photoresist 100 may be moved.

Now, the second exposure mechanism of this embodiment of the pattern forming apparatus of the present invention will be described below.

The second exposure mechanism 120 is adapted to form by exposure a bold pattern with a line width greater than the minimal pattern width that can be produced by means of the first exposure mechanism 110. In FIG. 1, reference symbols 124 and 126 denote a laser for bold pattern exposure and a lens, respectively.

For example, the second exposure mechanism 120 may have a configuration similar to that of the first exposure mechanism 110 and comprise a probe whose front end aperture has a diameter greater than that of the front end aperture of the probe 111 of the first exposure mechanism 110 or a laser lithography system.

When the second exposure mechanism 120 comprises a probe similar to that of the first exposure mechanism, the laser of the mechanism is turned on/off for irradiation/non-irradiation according to the exposure pattern data prepared for the pattern to be formed, while the probe is made to contact to scan the photoresist 100 for exposure on the xy plane as in the case of the first exposure mechanism.

When, on the other hand, the second exposure mechanism 120 comprises a laser lithography system unlike the first exposure mechanism, the laser of the lithography system is turned on/off for performing irradiation/non-irradiation according to the exposure pattern data prepared for the pattern to be formed, while the probe is made to scan the photoresist on the xy plane, using a laser beam having a wavelength that the photoresist 100 does not sense, measuring the distance between the probe and the photoresist in order to regulate the focal length of the probe.

Now, the operation of detecting the displacement of the above-described embodiment of the pattern forming apparatus according to the invention will be discussed below. With this embodiment, the relative displacement of the center of exposure of the first exposure mechanism 110 and that of the second exposure mechanism 120 is detected in order to carry out the exposure operation efficiently and accurately by using the above-described two exposure mechanisms. The process of detecting the relative displacement proceeds in a manner as described below.

First, a displacement detection mechanism 103 is placed on the stage 102.

More specifically, the displacement detection mechanism 103 is arranged at a position close to the photoresist 100 to be exposed to light that is placed on the stage 102. After detecting the positional displacement, both the displacement that can arise during the movement of the probe and the time necessary for moving the probe can be held to be small to improve the throughput when the distance by which the probe is moved to the exposure starting point on the photoresist 100 is short.

The positional displacement detection mechanism 103 comprises a photo detector and a displacement detection aperture. The displacement detection aperture is arranged on the photo detector. While there is no limit to the size of the displacement detection aperture, it is preferably greater than the diameter of the micro-aperture of the first exposure mechanism and smaller than the minimal line width that can be produced by the second exposure mechanism from the viewpoint of detection efficiency.

The displacement detection aperture can be formed by cutting the metal shield film on the transparent substrate by means of an FIB (focused ion beam) or by applying a photoresist on the metal shield film, exposing it to the near-field or laser beam, developing the photoresist and etching it.

Then, the beams of light are irradiated from the respective exposure systems and made to scan the positional detection aperture and its vicinity. The center of exposure of each of the exposure mechanisms is detected from the profile of the distribution of intensity of light obtained for the exposure mechanism.

When the second exposure mechanism is a beam exposure mechanism, it is adapted to focus the beam it emits on the displacement detection aperture as in the case of ordinary exposure before the detection of light. When, on the other hand, a probe having a micro-aperture and one having an aperture diameter not smaller than 100 nm are used for the exposure mechanisms, each of them is brought to a position close to the displacement detection aperture that allows it to detect light and causes it to operate for scanning.

Any of the above-described methods for controlling the distance between the micro-aperture and the photoresist 100 may also be used for controlling the distance between the probe and the displacement detection aperture.

With another displacement detection method, a displacement detection aperture as described above is used and the center of exposure of the second exposure mechanism is detected by a photo detector. Subsequently, the center of exposure of the first exposure mechanism is determined by observing the surface profile of the displacement detection aperture by means of the AFM function of the first exposure mechanism, and then the displacement of each of the exposure mechanisms is computationally determined by comparing the centers of exposure of the exposure mechanisms.

AFM as used herein refers to an atomic force microscope adapted to detect the atomic force that exists between the specimen and the probe to obtain image information on the surface profile of the specimen.

With still another displacement detection method that can be used when both of the exposure mechanisms comprise a probe having an aperture at the front end thereof, light is emitted from the side of the stage 102 to the displacement detection aperture and the displacement of each of the exposure mechanisms is computationally determined on the basis of the intensity of the SNOM signal obtained at the opposite side by using the SNOM function of the probe.

SNOM as used herein refers to a scanning near-field optical microscope adapted to obtain optical information, or near-field information, on the surface of the specimen by detecting scattered light produced by the surface of the specimen and the probe. The reflectance of the surface of the specimen including the changes in the reflectance can be obtained by observing the specimen by means of an SNOM.

With still another displacement detection method that can be used for the purpose of the invention, an optically structurally changeable medium is made to produce a structural change by exposing it to light at a spot by means of the second exposure mechanism 120, using a wavelength that can cause such a structural change. An optically structurally changeable medium as used herein refers to a fluorine-containing acrylate monomer to which a photo-polymerization initiator or a photo-polymerization promoter is added, or an optically structurally changeable material.

Subsequently, an image of the profile of the structurally changeable medium is obtained by means of the AFM function of the first exposure mechanism 110 and the center of exposure of the second exposure mechanism 120 is determined from the obtained profile. As a result, it is possible to detect the relative displacement between the centers of exposure of the two exposure mechanisms.

With still another displacement detection method that can be used for the purpose of the invention, a photochromic material is utilized. A photochromic material as used herein refers to a material in which a single chemical species can reversibly produce either of two states showing different respective absorption spectra by way of a rearrangement of the chemical bond without changing the molecular weight under the effect of light. Photochromic materials that can be used for the purpose of the invention include spiro benzo pyrane, azobenzene, fulgide and diarylethene.

The photochromic material is made to show a change in the absorption spectrum by exposing it to light at a spot by means of the second exposure mechanism 120, using a wavelength that can cause such a structural change. Subsequently, an SNOM image of the photochromic medium is obtained by means of the SNOM function of the first exposure mechanism 110 and the center of exposure of the second exposure mechanism 120 is determined on the basis of the obtained profile of the medium to detect the relative displacement of the centers of exposure of the two exposure mechanisms. At this time, while it is necessary to bring the probe 111 to a position close to the near-field region relative to the photochromic material, any of the above-described methods for controlling the distance between the micro-aperture and the photoresist 100 may also be used for controlling the distance between the probe and the photochromic material.

Now, the pattern exposure operation using this embodiment of pattern forming apparatus according to the invention will be described below.

After detecting the displacement of each of the two exposure mechanisms, the photoresist 100 applied to the surface of the substrate 104 is exposed to light.

To do this, first, the substrate 104 is rigidly secured onto the stage 102. Thereafter, the photoresist 100 is exposed to light by sequentially using the two exposure mechanisms in a manner as described above. Either of the first and second exposure mechanisms may be used first for the exposures.

After the first exposure operation using one of the exposure mechanisms is over and before conducting the second exposure operation using the other exposure mechanism, the distance separating the two exposure mechanisms is computationally determined by comparing the information on the relative displacement obtained in a manner as described above and the position of the exposure mechanism to be used for the second exposure operation as obtained from the exposure pattern data that have been read in advance, and the exposure mechanism to be used for the second exposure or the stage is moved appropriately.

When the operations of exposing the photoresist 100 to light are over, the photoresist 100 is developed to produce a photoresist pattern on the substrate 104. Once the photoresist pattern is obtained, it is now possible to produce a desired device pattern, which may have a size less than the wavelength of light, by means of a pattern forming operation such as etching, evaporation or lift-off conducted on the substrate 104, using the photoresist pattern as a mask.

Different systems and methods may be used appropriately depending on the device pattern producing layers of the substrate. For example, any of conventional photolithography systems such as an aligner and a stepper and a corresponding method may be used for producing a pattern layer that does not involve a pattern width less than the wavelength of light, whereas a system and a method according to the invention may be used for producing a pattern layer that involves a pattern width less than the wavelength of light.

As described above, according to the invention, in a device pattern producing process, it is now possible to produce both fine patterns with a size less than the wavelength of light and bold line patterns or solid large area patterns on the same substrate with a reduced overall exposure time by using two different exposure mechanisms, detecting the centers of exposure of the two exposure mechanisms and conducting respective exposure operations. The present invention is particularly effective for producing devices involving one or more patterns with a size less than the wavelength of light.

Now, the present invention will be described further by way of examples.

EXAMPLE 1

Figure 2:
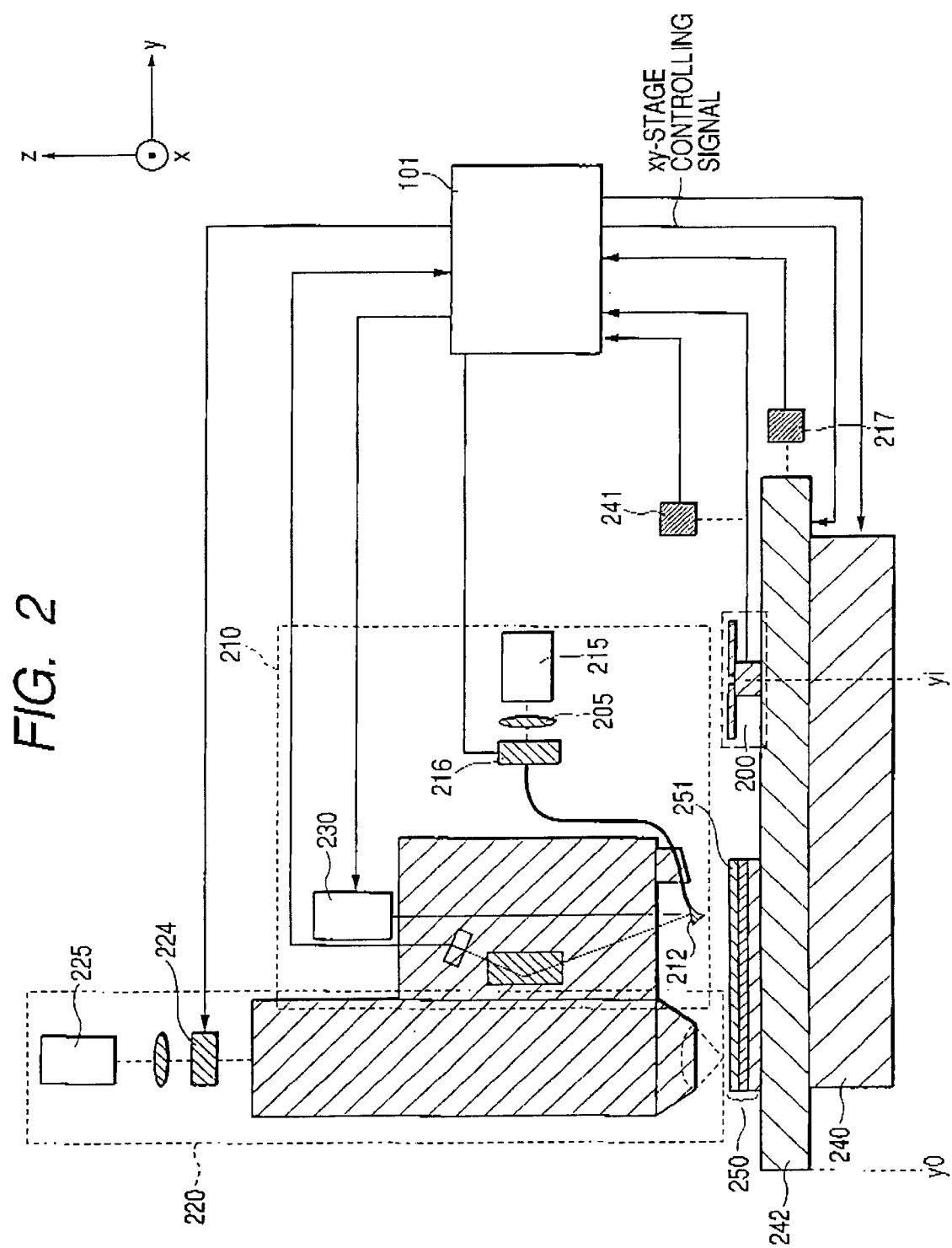
FIG. 2 is a schematic block diagram of the pattern forming apparatus according to the invention as used in Example 1, illustrating it in greater detail.

FIG. 2 is a schematic block diagram of the pattern forming apparatus according to the invention as used in Example 1, illustrating the positional relationship between the two exposure mechanisms during the operation of detecting the displacement of each of them.

As described above by referring to a preferred embodiment, the pattern forming apparatus of this example comprises a first exposure mechanism that is a near-field probe exposure mechanism employing a near-field probe having an aperture with a diameter of 30 nm at the front end thereof and a second exposure mechanism that is a laser lithography mechanism.

Now, the method and the apparatus for preparing a mask to be used for an excimer laser exposure system by forming a photoresist pattern by means of the pattern forming apparatus of this example to conduct patterning of the Cr film formed on a glass substrate will be described along with the mask itself.

First, a photo mask pattern is formed by means of a mask CAD. In this example, a positive type photoresist is used and exposed to light in a manner as defined by the CAD.

Then, the necessary data on the photo mask CAD are input to computer 101. It will be appreciated that the CAD patterns are automatically classified into two categories so that the mask CAD patterns with a pattern width not less than 800 nm are formed by means of a laser lithography mechanism 220 and those with a pattern width less than 800 nm are formed by means of a near-field probe exposure mechanism 210.

Figure 3:
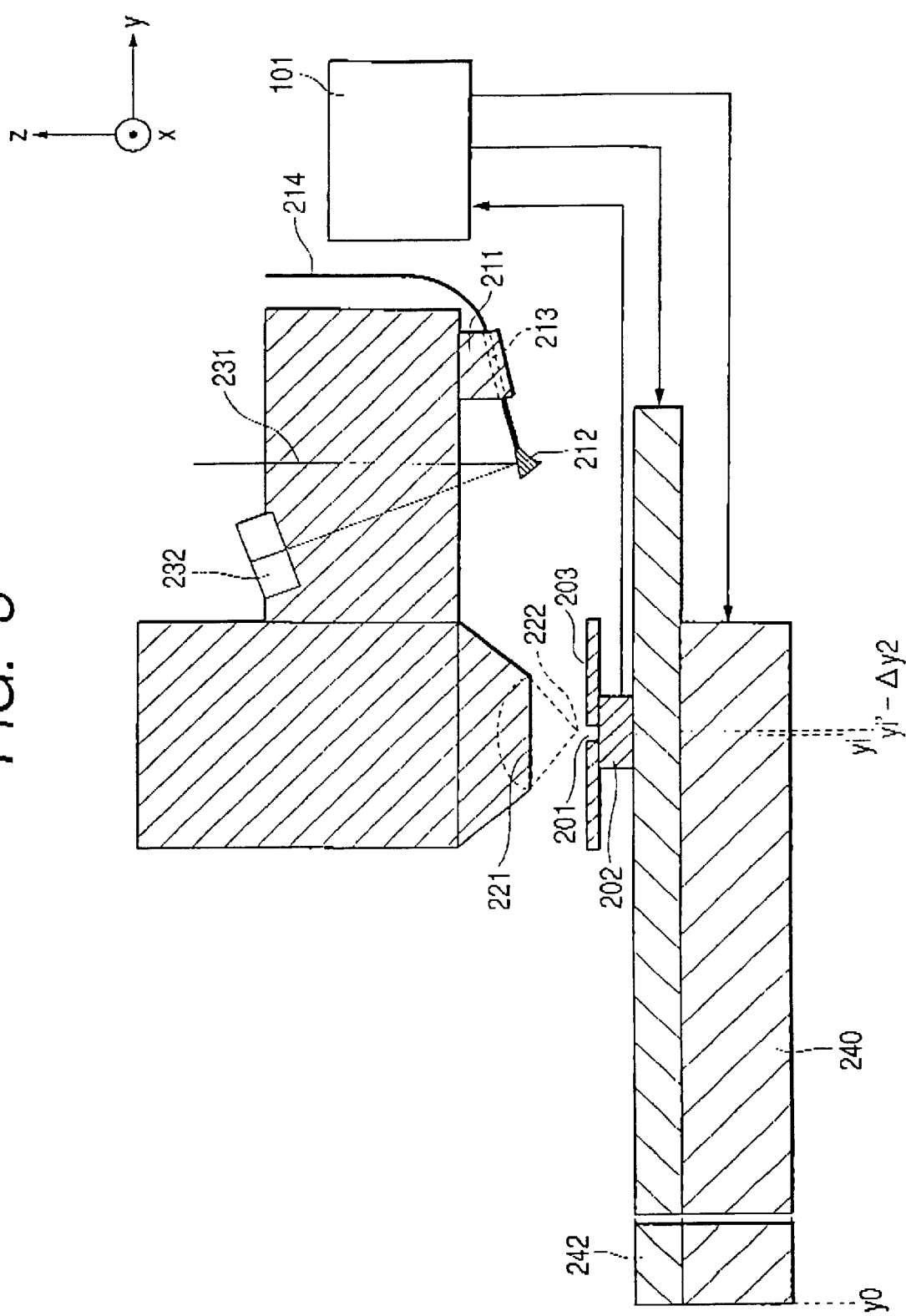
FIG. 3 is a schematic illustration of observing the center of exposure of a laser lithography system.

Then, as shown in FIGS. 3 and 4, a probe 212, having a profile of a rectangular pyramid and having a micro-aperture at the apex thereof formed by means of a semiconductor process having a step of anisotropically etching Si, is fitted to a probe holder 211 of the near-field probe exposure mechanism 210.

More specifically, the probe 212 is coated with a 100 nm thick Au shield film by sputtering and the optical micro-aperture is formed at the apex of the rectangular pyramid with a diameter of 30 nm by dry etching the pyramid from the apex. Additionally, an optical waveguide 213 is connected to the probe 212 and an optical fiber 214 is connected to the optical waveguide 213. Thus, as light is introduced into the optical fiber 214, the near-field is produced at and near the micro-aperture located at the front end of the probe 212.

When fitting the probe 212 to which the optical waveguide 213 is connected to the probe holder 211, the micro-aperture at the front end of the probe 212 is placed between a lower edge 221 of the lens holder of the laser lithography exposure mechanism 220 and a focused position 222 of the laser beam as viewed in the z-direction, because the scanning zone of the probe is advantageously broadened in the z-direction when the front end of the probe 212 is located at the middle between the lower edge 221 of the lens holder and the focused position 222 of the laser beam.

Then, the displacement of the center of exposure of the laser lithography mechanism 220 and that of the center of exposure of the near-field probe exposure mechanism 210 are detected in a manner as described below.

Figure 6:
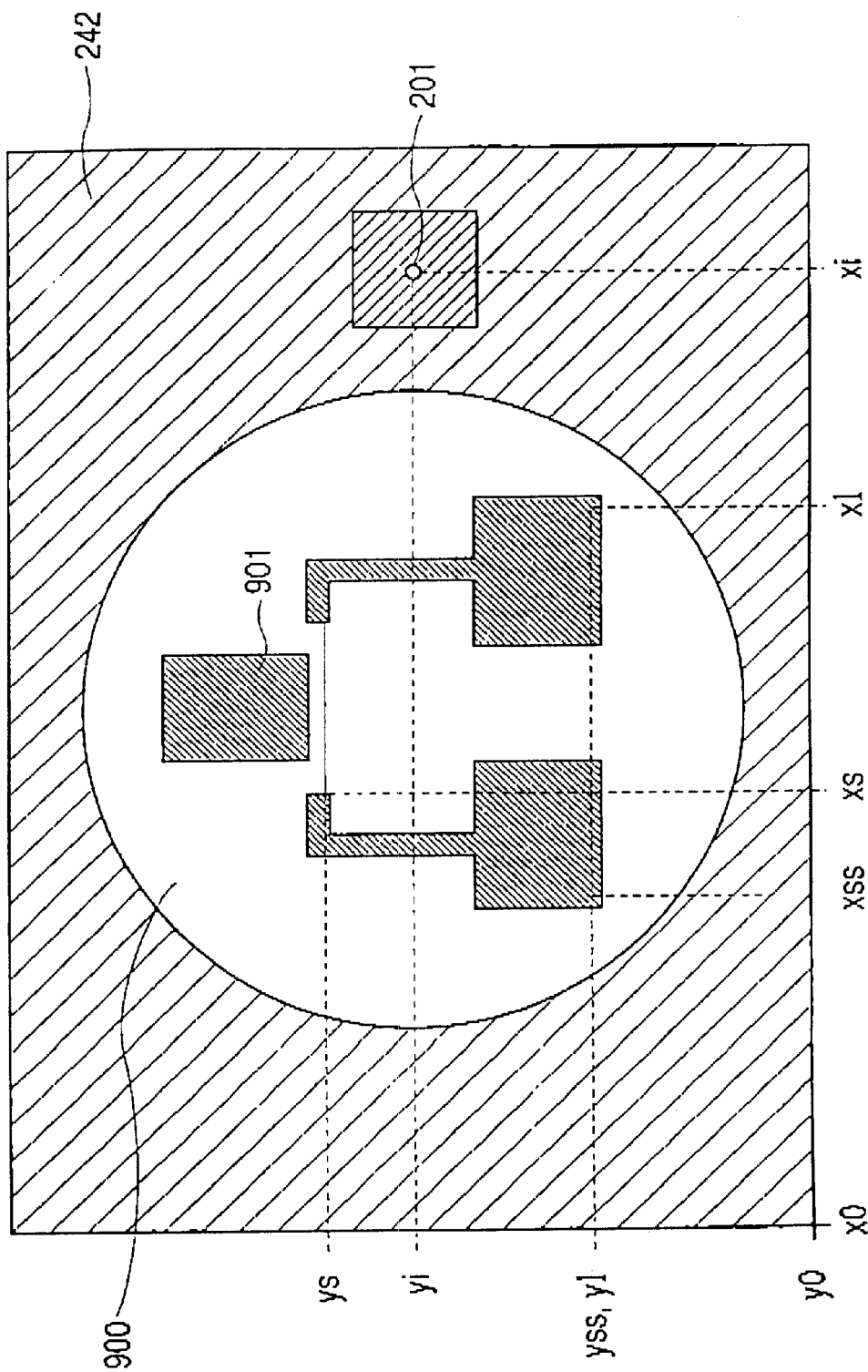
FIG. 6 is a schematic illustration of a coordinate system shown on an xy-stage.

FIG. 6 is a schematic illustration of a coordinate system shown on an xy-stage 242. It is assumed that the origin of the coordinate system specific to the xy-stage 242 is located at the lower left corner of the xy-stage in FIG. 6 and defined as (x0, y0) so that it may be used as a reference point.

Then, a displacement detection mechanism 200 is placed on the xy-stage 242. The displacement detection mechanism 200 is provided thereon with a displacement detection aperture 201 with a diameter of 200 nm for detecting the displacement relative to light. After installing the display detection mechanism 200, its position is determined by means of a laser interferometer (not shown) and then the position of the displacement detection aperture 201 is determined from the position of the display detection mechanism 200.

In this example, the position of the displacement detection aperture 201 is determined to be at (xi, yi) as a result of the measurement.

The displacement detection aperture 201 is produced by cutting an Al film formed on a glass substrate by evaporation at the center of the top of the displacement detection mechanism 200 by means of an FIB. A photodiode 202 is arranged below the displacement detection aperture 201 to measure the quantity of light transmitted through the displacement detection aperture 201.

Then, the xy-stage 242 is moved in such a way that the center of exposure of the laser lithography mechanism 220 comes close to the position (xi, yi) while observing through an optical microscope. The movement of the xy-stage 242 is measured by means of a laser interferometer 217. In this example, the measured movement of the xy-stage 242 is expressed by ($\Delta L'x$, $\Delta L'y$) (see FIG. 15).

As described earlier by referring to a preferred embodiment of the invention, the focused point 222 of the laser beam is aligned with the plane 203 containing the displacement detection aperture 201 (see FIG. 3) and, subsequently, the quantity of light is measured, while two-dimensionally scanning the displacement detection aperture 201 and its vicinity. Then, the center of exposure of the laser beam is detected from the obtained profile of the scanned area.

FIG. 5A shows the quantity of two-dimensionally transmitted light and FIG. 5C shows the cross-sectional profile obtained along the dotted broken line in FIG. 5A. It will be appreciated that light is transmitted scarcely in the dark area and abundantly in the bright area in FIG. 5A. In FIG. 5C, the vertical axis indicates the quantity of light and the horizontal axis indicates the x-coordinate. The coordinate of the center in FIG. 5A is expressed by (xi+$\Delta L'x$, yi+$\Delta L'y$).

The displacement of the center of the exposure of the beam along the x-coordinate is obtained by the average of the x-coordinate values of the two intersections of the level line representing ((maximum quantity of light)+(minimum quantity of light))/2 and the profile of the quantity of light. The displacement of the center of exposure of the beam along the y-coordinate is obtained in a similar manner. As the result of the above detecting operation, the center of exposure of the laser lithography mechanism 220 is defined in terms of the coordinate (xi, yi) of the displacement detection aperture and expressed by the formula below:

$$(xi+\Delta L'x+\Delta\alpha x,\ yi+\Delta L'y+\Delta\alpha y).$$

On the other hand, an AFM control method is used for the near-field probe exposure mechanism 210. With this method, position control light 231 (red laser beam, wavelength: 636 nm) from a position control light source 230 is introduced into the probe 212 through the back thereof as a position control means for the z-direction of the probe 212 so that light reflected by the probe 212 is detected by a dichotomizing sensor 232 (see FIG. 4).

The probe 212 and the displacement detection aperture 201 are brought close to each other with the precision of the micrometer scale by means of a z-stage 240, while observing them through an optical microscope. At the same time, they are aligned on the xy plane of the near-field probe exposure mechanism 210 with the precision of the micrometer scale by means of the xy-stage 242.

The movement of the xy-stage 242 with the alignment operation of the laser lithography mechanism 220 is measured by means of a laser interferometer 217. The movement is expressed by ($\Delta Lx$, $\Delta Ly$) in this example (see FIG. 15).

Then, the distance between the probe 212 and the displacement detection aperture 201 is reduced by using the z-stage 240, while oscillating the probe 212 with the resonance frequency. Then, the displacement detection aperture 201 and its vicinity are observed through an AFM in a tapping AFM mode of observing the surface profile through the fluctuations in the amplitude of oscillation of the cantilever.

FIG. 5B shows an obtained AFM image and FIG. 5D shows the cross-sectional profile obtained along the dotted broken line in FIG. 5B. It will be appreciated that the profile is low along the z-axis in the dark area and high along the z-axis in the light area in FIG. 5B. In FIG. 5D, the vertical axis indicates the height of the profile along the z-axis and the horizontal axis indicates the x-coordinate.

The center of exposure of the beam of the near-field probe exposure mechanism 210 along the x-coordinate is obtained by the average of the x-coordinate values of the two intersections of the level line representing ((maximum value)−(minimum value))/2 and the cross-sectional profile of the AFM image. The center of exposure along the y-coordinate is obtained in a similar manner.

As shown in FIG. 5D, the center of exposure of the near-field probe exposure mechanism 210 is defined in terms of the coordinate (xi, yi) of the displacement detected aperture and expressed by the formula below:

$$(xi+\Delta L'x+\Delta Lx+\Delta\beta x,\ yi+\Delta L'y+\Delta Ly+\Delta\beta y).$$

In this way, the displacement of the center of exposure of the laser lithography mechanism 220 and that of the near-field probe exposure mechanism 210 are determined on the basis of the detected data of the two centers of exposure and stored in the computer 101.

In this example, the displacement of the center of exposure of the near-field probe exposure mechanism 210 relative to that of the laser lithography mechanism 220 on the xy-plane is expressed by the formula below:

$$(\Delta Lx+\Delta\beta x-\Delta\alpha x,\ \Delta Ly+\Delta\beta y-\Delta\alpha y).$$

A stepping motor is used for moving the displacement detection device in the z-direction when detecting the centers of exposure. The operation of driving the displacement detection device and detecting the centers of exposure can be conducted highly accurately by using the external position detecting feature of the laser interferometer 241 with a resolution of 1 nm for feedback control purposes. The operation of moving the xy-stage is conducted by using a laser interferometer 217 in a similar manner.

Thereafter, photomask substrate 250 is placed on the xy-stage 242 and secured to the latter by means of a vacuum chuck.

The photomask substrate 250 is formed by forming a Cr film on a glass substrate to a thickness of 100 nm and subsequently forming a 100 nm thick layer of a positive type photoresist 251 for a g-line thereon by spin coating.

Now, the process of the exposure operation will be described below.

In the exposure operation, the laser lithography mechanism 220 and the near-field probe exposure mechanism 210 are used separately and sequentially. While either of them may be used first, the laser lithography mechanism 220 is used first in Example 1.

First, the laser beam is focused to a spot 222 on the surface of the photoresist 251.

The laser beam from the exposure light source 225 can be made to strike the spot described on the mask CAD by moving the xy-stage 242 in such a way that the focused position 222 of the laser beam is aligned with the specified lithography starting position for a pattern with a line width not less than 800 nm as indicated by the CAD data from the computer 101 to control the laser beam by means of AOM (acoustic optical modulator) 224.

Assume here that the exposure starting position on the xy-stage is (xss, yss).

The center of exposure of the beam lithography mechanism 220 is aligned with the exposure starting position on the xy-stage by moving the xy-stage by $(xss+\Delta L'x+\Delta \alpha x, yss+\Delta L'y+\Delta \alpha y)$.

Then, the exposure operation using the beam lithography mechanism 220 is started.

If an exposure pattern data of (x, y) is given, the xy-stage is moved by $(x+\Delta L'x+\Delta \alpha x, y+\Delta L'y+\Delta \alpha y)$ for the exposure operation of the beam lithography mechanism 220.

A blue SHG laser beam (wavelength: 430 nm) is used for the exposure operation. The focused position 222 of the laser beam can be moved without irradiating the laser beam by moving the xy-stage, using the control feature of the AOM 224.

When the exposure operation of the laser lithography mechanism 220 is over for the pattern with a line width not less than 800 nm, the xy-stage 242 is moved by referring to the relative displacement of the two exposure mechanisms that is measured initially to start the exposure operation of the near-field probe exposure mechanism 210 for a pattern with a line width less than 800 nm.

If the final position of the laser beam as used by the laser lithography mechanism 220 for the exposure operation is (x1, y1) and the initial position of the laser beam as used by the near-field probe exposure mechanism 210 for the exposure operation is (xs, ys), the distance between the photoresist 251 and the probe 212 is controlled by moving the xy-stage 242 by a distance of $(xs-x1+\Delta Lx+\Delta \beta x-\Delta \alpha x, ys-y1+\Delta Ly+\Delta \beta y-\Delta \alpha y)$ from the final position of the laser beam as used by the laser lithography mechanism 220 to start the exposure operation of the near-field probe exposure mechanism 210.

Thereafter, if an exposure pattern data of (x, y) is given, the xy-stage is moved by $(x+\Delta L'x+\Delta Lx+\Delta \beta x, y+\Delta L'y+\Delta Ly+\Delta \beta y)$ for the exposure operation of the near-field probe exposure mechanism 210 to obtain a latent image 901.

The distance between the photoresist 251 and the probe 212 is controlled in a manner as described above for controlling the distance between the photoresist and the displacement detection aperture 201. Light is emitted from the exposure light source 215 onto the photoresist 251 for the exposure operation by way of a lens 205 when the probe 212 comes into contact with the surface of the photoresist 251, which is then scanned, while maintaining a constant distance between the probe 212 and the photoresist 251. The light source 215 is a blue SHG laser adapted to emit a laser beam with a wavelength of 430 nm. The laser is controlled by the AOM 216 so as to irradiate the laser beam only to the area specified for exposure by the CAD data for patterning with a line width less than 800 nm.

When the exposure operation of the photoresist pattern is over, the photoresist 251 is developed to produce a photoresist pattern on the photo mask substrate 250. Then, a Cr pattern is formed by wet etching, using the photoresist pattern as an etching mask. Thereafter, the remaining resist is removed and a photo mask is formed for excimer lithography. A large and solid pattern can be formed with a shortened exposure time by following the above operational sequence even when bold patterns and fine patterns have to be formed to coexist. Furthermore, with the above-described arrangement, the bold patterns and the fine patterns can be accurately aligned.

While a pattern forming apparatus and a pattern forming method according to the invention are described in this example in terms of a mask to be used for excimer exposure, it should be noted that the present invention is by no means limited thereto.

A pattern forming apparatus and a pattern forming method according to the invention may be combined with ordinary semiconductor processes that may include an ordinary photolithography process, doping, metal evaporation, formation of oxide films, etching and/or lift-off to produce a single electronic device having metal wires, an electronic device such as a semiconductor laser or an optical device such as an SWS (sub-wavelength structure) or photonic crystals. Any of such devices are within the scope of the present invention.

EXAMPLE 2

Figure 7:
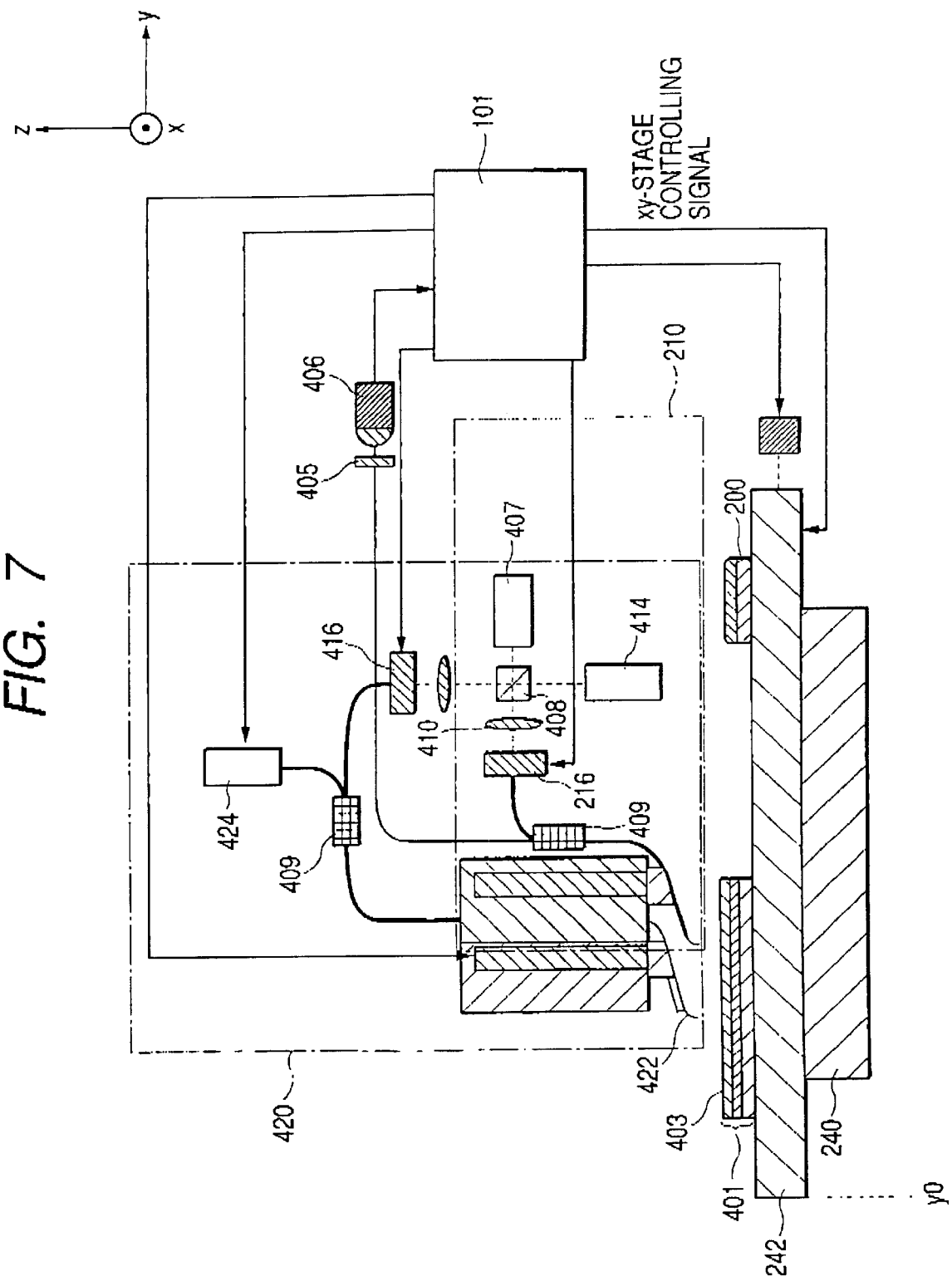
FIG. 7 is a schematic block diagram of the pattern forming apparatus according to the invention as used in Example 2.

FIG. 7 is a schematic block diagram of the pattern forming apparatus according to the invention comprising two probe exposure mechanisms that is used in Example 2. FIG. 8 is an enlarged partial view of the pattern forming apparatus of FIG. 7.

The two probe exposure mechanisms include a near-field probe exposure mechanism 210 comprising a probe 212 having a micro-aperture for accommodating a beam with a beam diameter of 50 nm at the front end thereof and a large aperture probe exposure mechanism 420 comprising a probe having a large aperture for accommodating a beam with a beam diameter of 500 nm at the front end thereof.

The probes of this example are formed in a manner as described below.

For the near-field probe exposure mechanism, a piece of optical fiber is sharpened at the front end by chemical etching and coated with a 100 nm thick Al film by evaporation. A micro-aperture is formed only at the front end of the optical fiber by conducting a resistance heating evaporation process in a direction perpendicular to the longitudinal direction of the optical fiber. As a result, a probe 212 for the near-field probe exposure mechanism 210 is formed with an aperture diameter of 50 nm.

For the large aperture probe exposure mechanism 420, another probe that is the same as the one described above and hence has an aperture of a diameter of 50 nm is pressed against a Ti thin film formed on a glass substrate and scraped to remove the metal at the front end thereof to enlarge the diameter of the front end aperture to 500 nm. In this way, a large aperture probe 422 having an aperture diameter of 500 nm is formed for the large aperture probe exposure mechanism 420.

Then, the probe 212 with the front end aperture diameter of 50 nm and the probe 422 with the front end aperture diameter of 500 nm are secured to respective probe holders 211 and 421. The apertures of the two probes are aligned in terms of the z-coordinate.

Now, the displacement of the center of exposure of the large aperture probe exposure mechanism 420 and that of the center of exposure of the near-field probe exposure mechanism 210 are detected in a manner as described below.

First, displacement detection mechanism 200 is placed on the xy-stage 242. This mechanism is made of a diarylethene crystal 400 that is a photochromic material. The crystal turns from pink to blue when irradiated with light having a wavelength of 633 nm.

The xy-stage 242 is moved relative to the surface of the diarylethene cyrstal 400 to align them in terms of the xy coordinates, while observing them through an optical microscope, and then the large aperture probe 422 and the diarylethene crystal 400 are brought closer relative to each other by means of the z-stage 240. At the same time, a voltage is applied to the piezoelectric device 425 connected to the probe holder 421 under the control of a control signal from the computer 101 to expand the piezoelectric device 425. On the other hand, the piezoelectric device 415 connected to the probe holder 211 of the probe 212 is contracted.

Thus, the large aperture probe 422 and the diarylethene crystal 400 are brought closer to the z-stage 240, while applying a predetermined voltage to the piezoelectric device 423 bonded to the large aperture probe 422 and observing the electrical resistance. When the large aperture probe 422 and the diarylethene crystal 400 are found so close to each other that an atomic force affects them, the large aperture probe 422 becomes distorted and, accordingly, the piezoelectric device 423 becomes distorted to change its electrical resistance. The change in the electrical resistance is detected, and when the large aperture probe 422 and the diarylethene crystal 400 come to contact each other, the laser beam having a wavelength of 633 nm from a red laser source 424 is irradiated only onto the spot where the large aperture probe 422 is in contact with the diarylethene crystal 400. As a result, the pink surface of the crystal turns into blue at and near the spot irradiated with the laser beam.

Thereafter, the piezoelectric device 425 of the large aperture probe exposure mechanism 420 is contracted until the front end of the large aperture probe 422 does not hit on the displacement detection mechanism even when the xy-stage 242 is moved. Then, the xy-stage 242 is moved to adjust the front end micro-aperture of the probe 212 so as to almost correspond to the position of exposure of the large aperture probe exposure mechanism 420, while observing them through an optical microscope.

The movement of the xy-stage for this adjusting operation in the xy-direction is expressed by ($\Delta$Lx, $\Delta$Ly) as observed by a laser interferometer in this example.

Then, the piezoelectric device 415 of the near-field probe exposure mechanism 210 is expanded, while observing it through an AFM, using the change in the electrical resistance of the piezoelectric device 415, until the micro-aperture at the front end of the probe 212 and the surface of the diarylethene crystal 400 reach the near-field region, and then an SNOM image is obtained by a two-dimensional scanning operation of the large aperture probe exposure mechanism 420, using the xy-stage 242 near the exposed area.

In this example, such an SNOM image is obtained in a manner as described below.

The near-field is generated near the front end aperture of the probe 212 by introducing a laser beam from a He—Cd laser 407 (wavelength: 442 nm) into the probe 212 by way of a half mirror 408, a lens 410, an AOM 216 and an optical coupler 409. Then, light scattered at the surface of the diarylethene crystal 400 as a result of bringing the probe 212 and the diarylethene crystal 400 close to the front end aperture is detected by a photomultiplier tube 406 by way of the micro-aperture of the probe 212 and a filter 405. A two-dimensional SNOM image is obtained by conducting a two-dimensional scanning operation, using the probe. This technique of obtaining an SNOM image is referred to as the illumination collection (IC) mode.

The SNOM image obtained in the IC mode tells the intensity of light reflected by the surface of the specimen. Therefore, the pink area and the blue area on the surface of the diarylethene crystal 400 are reflected to the SNOM image as differences in the intensity of reflected light (see FIGS. 9A and 9B).

Figure 9B:
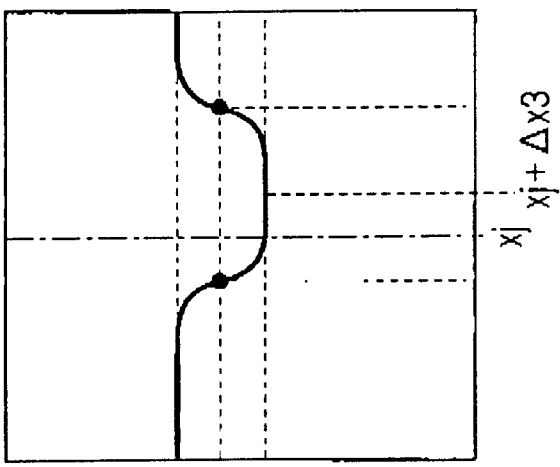
FIGS. 9A and 9B are illustrations of the quantity and the area of illumination of light reflected from a diarylethene crystal.
Figure 9A:
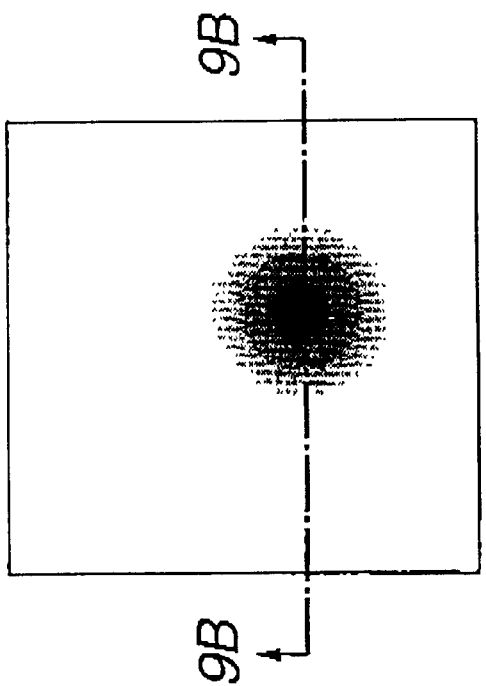

FIG. 9A schematically illustrates the obtained SNOM image and FIG. 9B is a schematic cross-sectional view taken along the dotted broken line in FIG. 9A. In FIG. 9A, the dark area is the area where light is poorly reflected, whereas the bright area is the area where light is strongly reflected. In FIG. 9B, the vertical axis represents the quantity of light and the horizontal axis represents the x-coordinate. The relative displacement of the center of exposure of the near-field probe exposure mechanism 210 and that of the large aperture probe exposure mechanism 420 is determined from the profile of the cross section of the obtained SNOM image. From FIGS. 9A and 9B, the relative displacement of the center of exposure of the near-field probe exposure mechanism 210 and that of the large aperture probe exposure mechanism 420 of this example is expressed by the formula below in terms of the coordinates of the center of exposure of the near-field probe exposure mechanism 210, or (xj, yj):

$$(\Delta Lx + \Delta x3, \Delta Ly + \Delta y3).$$

Then, a substrate 401 coated with an 80 nm thick photoresist 403 film by spin coating is placed on the xy-stage 242 and secured to the latter by means of a vacuum chuck.

In the exposure operation, the large aperture probe exposure mechanism 420 and the near-field probe exposure mechanism 210 are used separately and sequentially. Either of them may be used first.

For the exposure operation, as in the case of Example 1, the probe of each of the exposure mechanisms is aligned with the photoresist 403 by moving the xy-stage 242 and operating the z-stage 240, and the pixel devices 415, 425 relative to the spot of exposure as in the operation of detecting the center of exposure of each of the exposure mechanisms. The exposure operation is conducted by irradiating a laser beam from an exposure light source while controlling the AOMs (acoustic optical modulators) 216, 416. A He—Cd laser 407 adapted to emit a laser beam of a wavelength of 442 nm is used for the exposure light source.

The probes can be moved without exposing the specimen to light by moving the xy-stage 242, using the control feature of the respective AOMs 216 and 416.

When the exposure operation of either of the exposure mechanisms is over, the xy-stage 242 is moved by a distance corresponding to the relative displacement of the two exposure mechanisms obtained in advance or ($\Delta$Lx+$\Delta$x3, $\Delta$Ly+$\Delta$y3) and the piezoelectric devices 415, 425 are expanded and contracted before conducting the exposure operation of the other exposure mechanism.

In this way, it is possible to prepare patterns in a flexible manner with an enhanced throughput even when patterns with different pattern widths including those having a large pattern width and those having a small pattern width coexist.

For replacing either of the probes with a new one for exposure, a beam of an Ar ion laser (wavelength: 488 nm)

is applied onto the diarylethene crystal 400 before replacing the probe to turn the color of the crystal 400 back to pink, so that the relative displacement of the two exposure mechanisms may be determined for another time.

While the two exposure mechanisms of the example are a large aperture probe exposure mechanism and a near-field probe exposure mechanism, the present invention is by no means limited thereto.

Alternatively, a beam lithography mechanism and a near-field probe exposure mechanism may be used as in the case of Example 1.

EXAMPLE 3

In this example, a method different from that of Example 1 is used for determining the relative positions of the centers of exposure of the two exposure mechanisms, although a near-field probe exposure mechanism using a near-field probe with a front end aperture of a diameter of 30 nm and a laser lithography mechanism are used as two exposure mechanisms as in the case of Example 1.

The preparation of pattern data to be used for exposing the photoresist 251 to light, the preparation of the probe 212, the fitting of the probe 212 and the installation of the displacement detection mechanism 200 having a displacement detection aperture 201 are the same and identical with those of Example 1. The entire device arrangement of the example is also the same as the one illustrated in FIGS. 2, 3 and 4.

The relative displacement of the center of exposure of the laser lithography mechanism 220 and that of the near-field probe exposure mechanism 210 is detected by means of the displacement detection aperture 201 in a manner as described below.

Figure 10A:
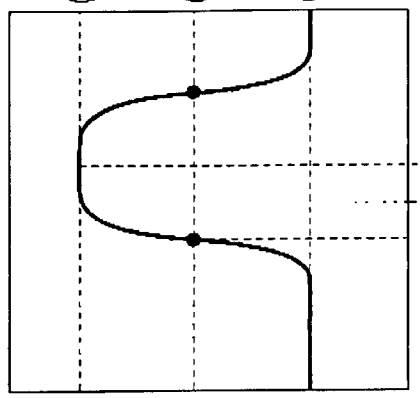
FIGS. 10A, 10B, 10C and 10D are illustrations of the quantity and the area of illumination of light transmitted through a position detecting aperture.
Figure 10C:
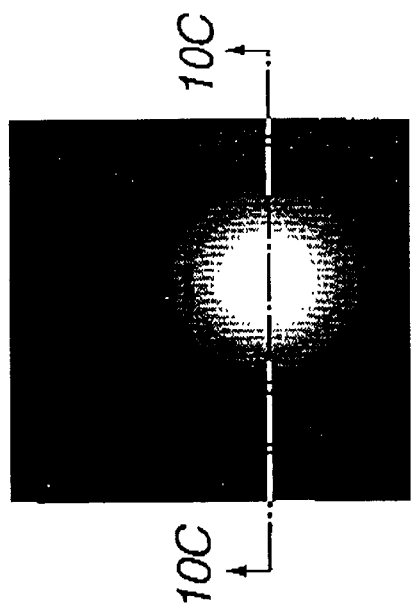

First, as in Example 1, the center of exposure of the laser lithography mechanism 220 is detected. FIG. 10A shows the quantity of two-dimensionally transmitted light and FIG. 10C shows the cross-sectional profile obtained along the dotted broken line in FIG. 10A. It will be appreciated that light is transmitted scarcely in the dark area and abundantly in the bright area in FIG. 10A. In FIG. 10C, the vertical axis indicates the quantity of light and the horizontal axis indicates the x-coordinate. The coordinates of the center in FIG. 10A are expressed by $(xi+\Delta L'x, yi+\Delta L'y)$.

The center of exposure of the laser lithography mechanism 220 is defined in terms of the coordinates (xi, yi) of the displacement detection aperture and expressed by the formula below:

$$(xi+\Delta L'x+\Delta\alpha x, yi+\Delta L'y+\Delta\alpha y).$$

Then, to detect the displacement of the center of exposure of the near-field probe exposure mechanism 210, the displacement detection aperture 201 is irradiated with light so that the irradiated spot is detected by photodiode 202 as in the case of the laser lithography mechanism 220.

The xy coordinates of the probe 212 are regulated to become substantially aligned with the displacement detection aperture 201 by moving the xy-stage 242 while observing the probe through an optical microscope.

In this operation, the xy-stage 242 is moved in the xy directions by ($\Delta Lx$, $\Delta Ly$) as determined by a laser interferometer.

Then, the probe 212 is moved into an area where a near-field is to be found relative to the plane 203 having the displacement detection aperture, and the laser beam from the light source 215 for exposure is introduced into the probe 212 by way of an AOM 216. The near-field is generated through the micro-aperture at the front end of the probe 212 and the displacement detection aperture 201 and its vicinity is two-dimensionally scanned to obtain an image of the quantity of light two-dimensionally transmitted through the displacement detection aperture 201.

Figure 10B:
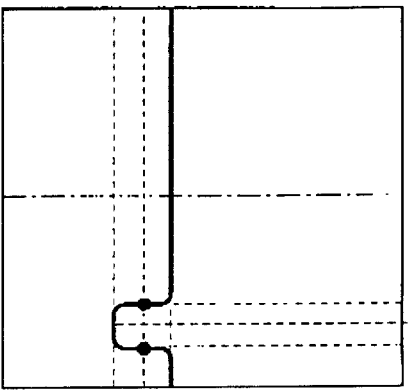
Figure 10D:
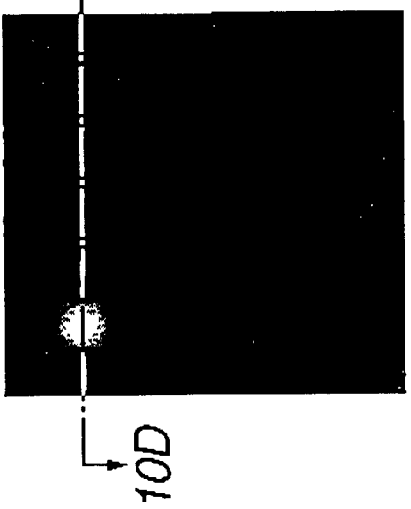

FIG. 10B shows the obtained image and FIG. 10D shows the cross-sectional profile obtained along the dotted broken line in FIG. 10B. It will be appreciated that light is transmitted scarcely in the dark area and abundantly in the bright area in FIG. 10B. In FIG. 10D, the vertical axis indicates the quantity of light and the horizontal axis indicates the x-coordinate. From FIG. 10D, the center of exposure of the near-field probe exposure mechanism 210 is defined in terms of the coordinates (xi, yi) of the displacement detection aperture and expressed by the formula below:

$$(xi+\Delta L'x+\Delta Lx+\Delta\beta x, yi+\Delta L'y+\Delta Ly+\Delta\beta y).$$

The displacement of the center of exposure of the laser lithography mechanism 220 and that of the center of exposure of the near-field probe exposure mechanism 210 are computationally determined from the data obtained for the positions of the two centers of exposure and stored in the computer 101.

In this example, the displacement of the center of exposure of the near-field probe exposure mechanism 210 relative to that of the laser lithography mechanism 200 on the xy plane is expressed by the formula below:

$$(\Delta Lx+\Delta\beta-\Delta\alpha x, \Delta Ly+\Delta\beta y-\Delta\alpha y).$$

Once the quantity of displacement is determined, it is possible to form a large and solid pattern with a shortened exposure time by following the above operational sequence even when bold patterns and fine patterns have to be formed to coexist.

While the two exposure mechanisms of the example are a beam lithography mechanism and a near-field probe exposure mechanism, the present invention is by no means limited thereto. Alternatively, a large aperture probe exposure mechanism and a near-field probe exposure mechanism may be used as in the case of Example 2.

Additionally, while a displacement detection aperture is used as a displacement detection means in this example, a photochromic material may alternatively be used as in the case of Example 2.

EXAMPLE 4

FIG. 11 is a schematic block diagram of the pattern forming apparatus according to the invention as used in Example 4 and comprising a large aperture probe mechanism and a near-field probe exposure mechanism. This example differs from Example 2 in terms of the method for determining the relative positions of the centers of exposure of the two exposure mechanisms.

As pointed out above, the pattern forming apparatus of this example comprises two probe exposure mechanisms including a near-field probe exposure mechanism provided with a near-field probe having an aperture of a diameter of 30 nm at the front end thereof and a laser lithography mechanism as in the case of Example 2.

The relative displacement of the center of exposure of the large aperture exposure mechanism 420 and that of the near-field probe exposure mechanism 210 is determined in a manner as described below.

Referring to FIG. 11, a displacement detection mechanism is placed on the xy-stage 242. The displacement detection mechanism is composed of a material obtained by adding a thioxauthone type photo-polymerization initiator and a photo-polymerization promoter into a fluorine-containing acrylate monomer that is an optically structurally changeable material 800. This material is characterized in that its optical structure changes to produce a recess when irradiated with light with a wavelength of 441 nm.

First, a laser beam with a wavelength of 441 nm is applied onto the surface of this optically structurally changeable material 800 from a blue laser source 824 by way of the large aperture probe exposure mechanism as in Example 2. At this time, the laser beam is applied only to the spot where the large aperture probe comes into contact with the optically structurally changeable material 800. Then, as a result, the optically structurally changeable material 800 is structurally changed at the spot on the surface onto which light has been applied to produce a recess there.

Subsequently, as in Example 2, the xy-stage 242 is moved to adjust the front end micro-aperture of the probe 212 so as to almost correspond to the position of exposure of the large aperture probe exposure mechanism 420, while observing them by means of the AFM feature.

The movement of the xy-stage for this regulating operation in the xy-direction is expressed by ($\Delta$Lx, $\Delta$Ly) as observed by a laser interferometer in this example.

Figure 12B:
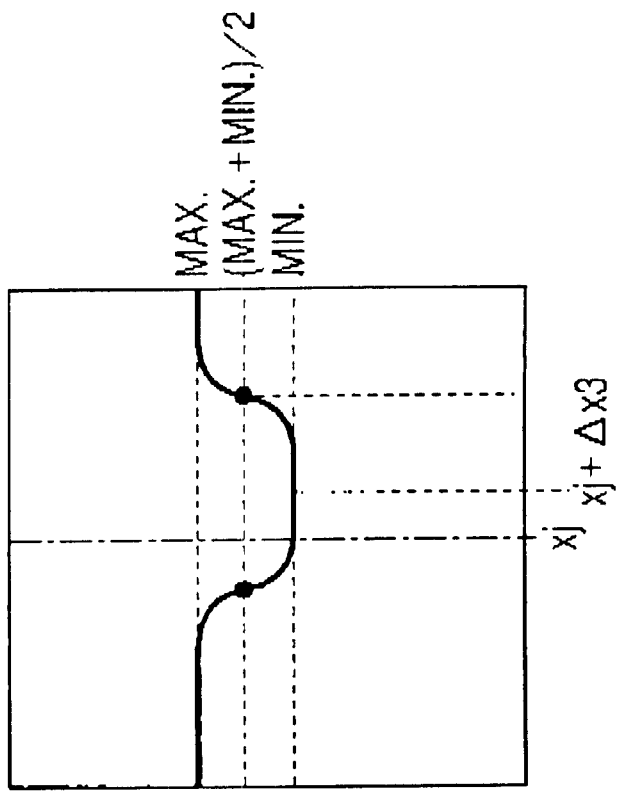
FIGS. 12A and 12B are illustrations of the surface profile of an optically structurally changeable material as obtained by an observation.
Figure 12A:
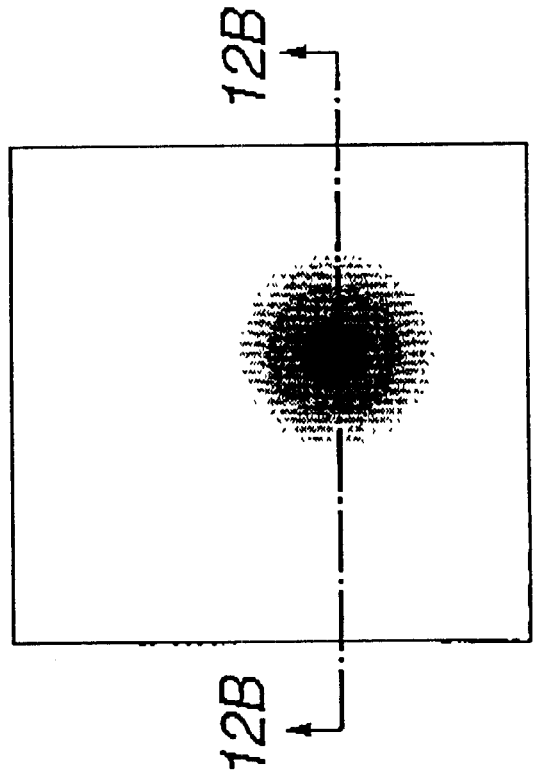

FIG. 12A shows an obtained AFM image and FIG. 12B shows the cross-sectional profile obtained along the dotted broken line in FIG. 12A. It will be appreciated that the profile is low in the dark area and high in the bright area in FIG. 12A. In FIG. 12B, the vertical axis indicates the height of the profile along the z-axis and the horizontal axis indicates the x-coordinate. Then, the relative displacement of the center of exposure of the near-field probe exposure mechanism 210 and that of the large aperture probe exposure mechanism 420 is determined. The relative displacement of the center of exposure of the near-field probe exposure mechanism 210 and that of the large aperture probe exposure mechanism 420 of this example is expressed by the formula below in terms of the coordinates of the center of exposure of the near-field probe exposure mechanism 210, or (xj, yj):

$$(\Delta Lx + \Delta x3, \Delta Ly + \Delta y3).$$

After determining the displacement, the process of Example 2 is followed to expose the photoresist.

In this way, it is possible to prepare patterns in a flexible manner with an enhanced throughput even when patterns with different pattern widths including those having a large pattern width and those having a small pattern width coexist.

While the two exposure mechanisms of the example are a large aperture probe exposure mechanism and a near-field probe exposure mechanism, the present invention is by no means limited thereto. Alternatively, a beam lithography mechanism and a near-field probe exposure mechanism may be used as in the case of Example 1.

EXAMPLE 5

Figure 13:
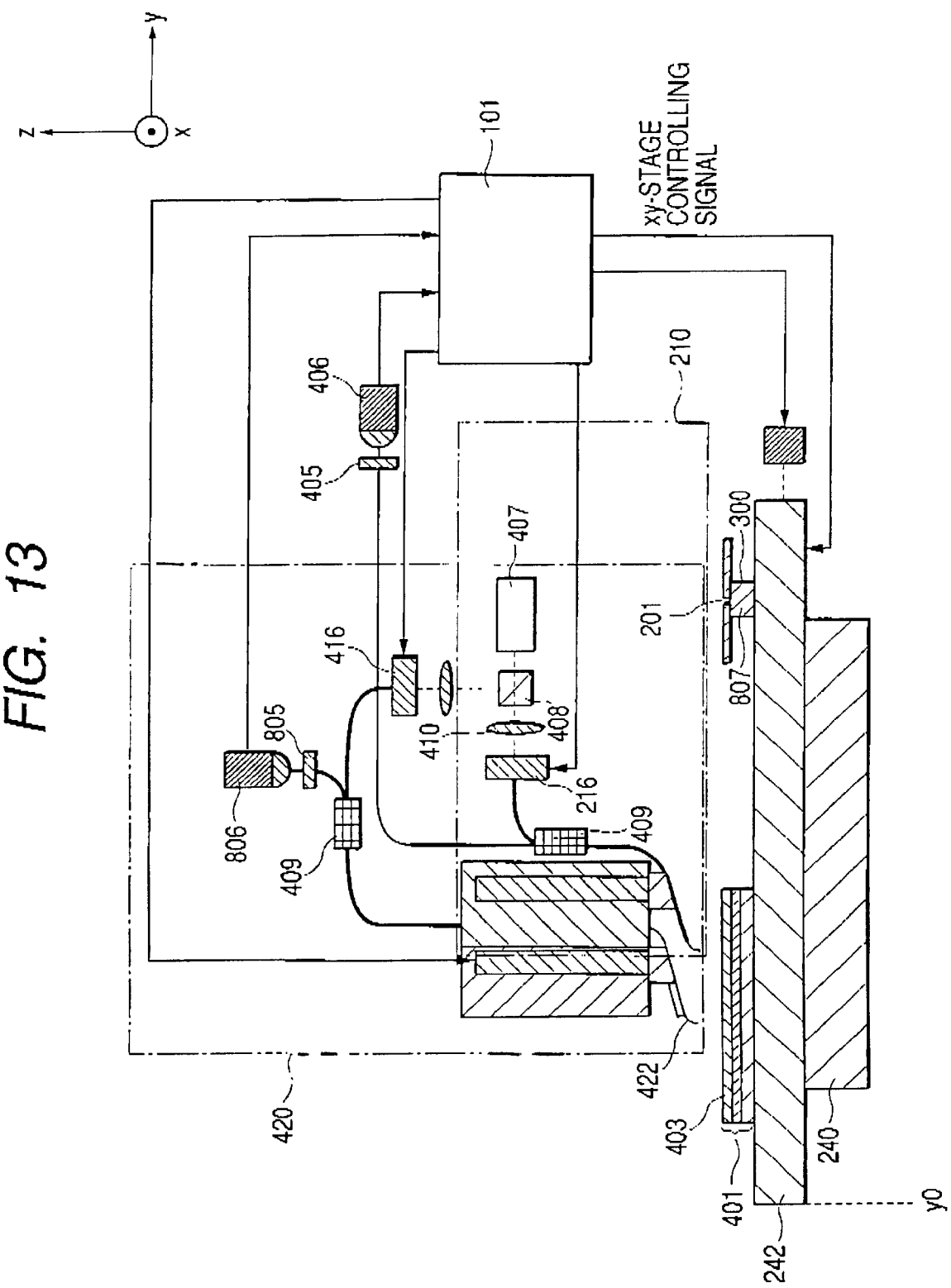
FIG. 13 is a schematic block diagram of the pattern forming apparatus according to the invention as used in Example 5.

FIG. 13 is a schematic block diagram of the pattern forming apparatus according to the invention as used in Example 5, said system comprising two probe exposure mechanisms including a large aperture probe exposure mechanism and a near-field probe exposure mechanism. More specifically, the two probe exposure mechanisms include a near-field probe exposure mechanism comprising a probe having a micro-aperture for accommodating a beam with a beam diameter of 50 nm at the front end thereof and a large aperture probe exposure mechanism comprising a probe having a large aperture for accommodating a beam with a beam diameter of 500 nm at the front end thereof.

The process of preparing pattern data to be used when exposing photoresist 401 to light, that of preparing the probes and that of fitting the probes in position are the same as those of Example 2.

In this example, the relative displacement of the center of exposure of the large aperture probe exposure mechanism 420 and the near-field probe exposure mechanism 210 is determined in a manner as described below.

A displacement detection mechanism 300 has a displacement detection aperture 201 on the top thereof and a light emitting device 807 at the bottom thereof so that light emitted from the light emitting device 807 can be introduced into the displacement detection aperture 201. In this example, the light emitting device is a vertical cavity surface emission laser.

As described earlier for Example 2, the front end of each of the probes is brought close to the displacement detection aperture 201 of the displacement detection mechanism 300 having the light emitting device. Then, light coming from the light emitting device 807 through the displacement detection aperture 201 is detected and led to pass through filters 405, 805 and photomultiplier tubes 406, 806, while two-dimensionally scanning the displacement detection aperture 201 and its vicinity by means of each of the probes, using the xy-stage. As a result, an image of the quantity of two-dimensionally transmitted light of each of the exposure mechanisms can be obtained. FIGS. 14A, 14B, 14C and 14D illustrate the obtained images.

Figure 14A:
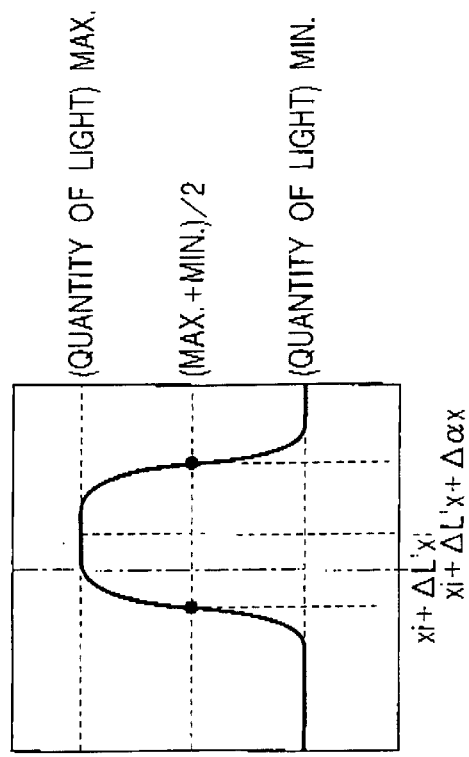
FIGS. 14A, 14B, 14C and 14D are illustrations of the quantity and the area of illumination of light transmitted through a position detecting aperture as observed by means of a probe.
Figure 14B:
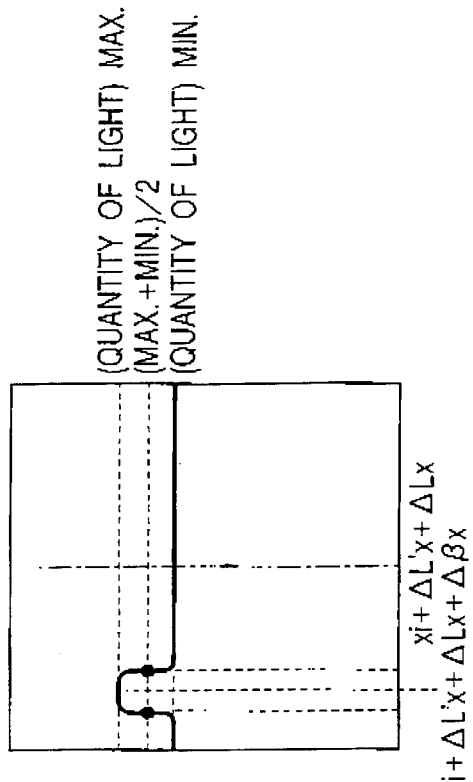
Figure 14C:
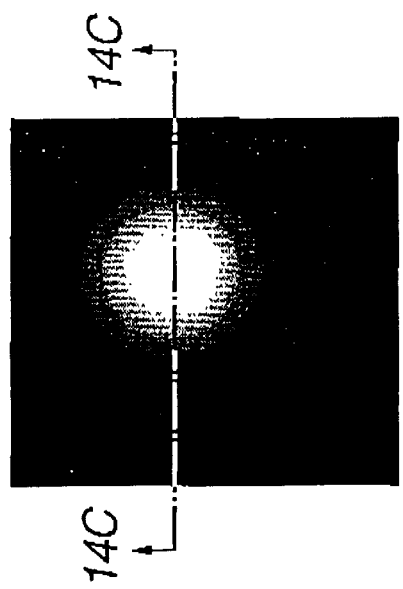

More specifically, FIG. 14A shows an image of the quantity of two-dimensionally transmitted light obtained for the large aperture probe exposure mechanism 420 and FIG. 14C shows the cross-sectional profile obtained along the dotted broken line in FIG. 14A. It will be appreciated that light is transmitted scarcely in the dark area and abundantly in the bright area in FIG. 14A. In FIG. 14C, the vertical axis indicates the quantity of light and the horizontal axis indicates the x-coordinate.

The coordinates of the center in FIG. 14A are expressed by (xi+$\Delta$L'x, yi+$\Delta$L'y). Then, the center of exposure of the laser lithography mechanism 220 is defined in terms of the coordinates (xi, yi) of the displacement detection aperture and expressed by the formula below:

$$(xi + \Delta L'x + \Delta \alpha x, yi + \Delta L'y + \Delta \alpha y).$$

Figure 14D:
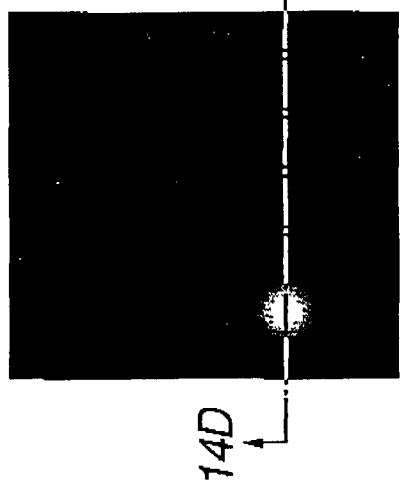

Similarly, the displacement of the center of exposure of the near-field probe exposure mechanism 210 is determined. FIG. 14B shows an image of the quantity of two-dimensionally transmitted light obtained for the near-field probe exposure mechanism 210 and FIG. 14D shows the cross-sectional profile obtained along the dotted broken line in FIG. 14B. It will be appreciated that light is transmitted scarcely in the dark area and abundantly in the bright area in FIG. 14B. In FIG. 14D, the vertical axis indicates the quantity of light and the horizontal axis indicates the x-coordinate.

From FIG. 14D, the center of exposure of the near-field probe exposure mechanism 210 is defined in terms of the coordinates (xi, yi) of the displacement detection aperture and expressed by the formula below:

$$(xi + \Delta L'x + \Delta Lx + \Delta \beta x, yi + \Delta L'y + \Delta Ly + \Delta \beta y).$$

The displacement of the center of exposure of the large aperture probe exposure mechanism 420 and that of the center of exposure of the near-field probe exposure mechanism 210 are computationally determined from the data obtained for the positions of the two centers of exposure and stored in the computer 101.

In this example, the displacement of the center of exposure of the large aperture probe exposure mechanism 420 relative to that of the near-field probe exposure mechanism 210 on the xy plane is expressed by the formula below:

$$(\Delta Lx+\Delta\beta x-\Delta\alpha x,\ \Delta Ly+\Delta\beta y-\Delta\alpha y).$$

Once the quantity of displacement is determined, it is possible to form a large and solid pattern with a shortened exposure time by following the above operational sequence even when bold patterns and fine patterns have to be formed to coexist.

What is claimed is:

1. A pattern forming apparatus for forming a pattern on a substrate, said apparatus comprising:
   a first exposure section capable of conducting pattern exposure for a predetermined line width, wherein said first exposure section is a scanning exposure mechanism comprising a probe for near-field exposure;
   a second exposure section for conducting pattern exposure for a line width greater than the predetermined line width of said first exposure section; and
   means for detecting the relative positional relationship between said first exposure section and said second exposure section,
      wherein pattern exposure is conducted by using said first exposure section and said second exposure section on the basis of the detected positional relationship.

2. The pattern forming apparatus according to claim 1, wherein said probe for near-field exposure has a micro-aperture not greater than 100 nm at a front end thereof to be used for forming a pattern with a line width not greater than 100 nm.

3. The pattern forming apparatus according to claim 1, wherein said second exposure section is a scanning laser lithography mechanism in which light is collected by means of a lens.

4. The pattern forming apparatus according to claim 1, wherein said second exposure section is a scanning exposure mechanism comprising a probe having an aperture not smaller than 100 nm at a front end thereof.

5. The pattern forming apparatus according to claim 1, further comprising a stage for supporting the substrate, one of said first exposure section and said second exposure section being aligned with the substrate after conducting pattern exposure by using the other exposure section, on the basis of the detected positional relationship.

6. The pattern forming apparatus according to claim 1, wherein said means for detecting the relative positional relationship comprises:
   a position detecting aperture;
   a photodetector for detecting light passing through said aperture; and
   computation means for computationally determining the positional relationship of said first exposure section and said second exposure section from information detected by said photodetector.

7. The pattern forming apparatus according to claim 6, wherein said computation means computationally determines the positional relationship by comparing the center of exposure of said second exposure section as obtained by measuring the exposure light transmitted through said aperture with the center of exposure of said first exposure section as obtained from the surface profile of said aperture and its vicinity as measured by said probe for near-field exposure.

8. The pattern forming apparatus according to claim 6, wherein said computation means computationally determines the positional relationship by detecting scattered light generated at and near the probe of each of said first exposure section and said second exposure section from light applied to said aperture in a direction opposite to the direction of incoming light for exposure.

9. The pattern forming apparatus according to claim 1, wherein said means for detecting the relative positional relationship comprises an optically structurally changeable material and is adapted to computationally determine the positional relationship of said first exposure section and said second exposure section by measuring the surface profile of said optically structurally changeable structure by said probe for near-field exposure, while irradiating said optically structurally changeable material with light having a wavelength which causes a structural change of said optically structurally changeable material by means of said second exposure section.

10. The pattern forming apparatus according to claim 6, wherein said aperture has a diameter larger than the diameter of the micro-aperture of the probe for near-field exposure of said first exposure section.

11. The pattern forming apparatus according to claim 10, wherein said aperture has a diameter smaller than the minimum pattern line width that can be formed by said second exposure section.

12. The pattern forming apparatus according to claim 1, wherein said means for detecting relative positional relationship comprises a structural body made of a photochromic material and is adapted to computationally determine the positional relationship of said first exposure section and said second exposure section by measuring the surface color of said photochromic material by said probe for near-field exposure, while irradiating said photochromic material with light having a wavelength which causes a color change of said photochromic material by means of said second exposure section.

13. A pattern forming method comprising the steps of:
   detecting a positional relationship of a first exposure section capable of conducting pattern exposure for a predetermined line width and a second exposure section for conducting pattern exposure for a line width greater than the predetermined line width of the first exposure section; and
   conducting a first exposure step using one exposure section, which exposure step is conducted by means of a probe for near-field exposure having a micro-aperture, subsequently aligning the other exposure section to an exposure position on the basis of the detected positional relationship and conducting a second exposure step using the other exposure section.

14. The pattern forming method according to claim 13, further comprising conducting the pattern exposure on the same photoresist both in said first exposure step and in said second exposure step.

15. The pattern forming method according to claim 13, wherein said second exposure step comprises an exposure step of performing laser lithography in which light is collected by means of a lens.

16. The pattern forming method according to claim 13, wherein said second exposure step comprises an exposure step that uses a probe having an aperture not smaller than 100 nm at a front end thereof.

* * * * *

UNITED STATES PATENT AND TRADEMARK OFFICE
CERTIFICATE OF CORRECTION

PATENT NO. : 6,559,926 B2  Page 1 of 1
DATED : May 6, 2003
INVENTOR(S) : Takako Yamaguchi et al.

It is certified that error appears in the above-identified patent and that said Letters Patent is hereby corrected as shown below:

Column 8,
Line 63, "comer" should read -- corner --.

Column 15,
Line 60, "directions" should read -- direction --.

Column 16,
Line 25, "200" should read -- 220 --.
Line 29, "$\Delta\beta$-" should read -- $\Delta\beta x$- --.
Line 62, "aperture" should read -- aperture probe --.

Signed and Sealed this

Eleventh Day of November, 2003

JAMES E. ROGAN
*Director of the United States Patent and Trademark Office*